US005641694A

United States Patent [19]

Kenney

[11] Patent Number: 5,641,694
[45] Date of Patent: Jun. 24, 1997

[54] METHOD OF FABRICATING VERTICAL EPITAXIAL SOI TRANSISTOR

[75] Inventor: Donald McAlpine Kenney, Shelburne, Vt.

[73] Assignee: International Business Machines Corporation, Armonk, N.Y.

[21] Appl. No.: 361,606

[22] Filed: Dec. 22, 1994

[51] Int. Cl.$^{6}$ .......... H01L 21/205; H01L 21/8242

[52] U.S. Cl. .......... 438/156; 438/242; 438/489

[58] Field of Search .......... 437/47, 52, 60, 437/40 RG, 41 RG, 41 CS, 203, 89, 90, 93, 99; 148/DIG. 168

[56] References Cited

U.S. PATENT DOCUMENTS

| | | | |
|---|---|---|---|
| 4,141,765 | 2/1979 | Druminski et al. | 437/93 |
| 4,649,625 | 3/1987 | Lu | 29/571 |
| 4,651,184 | 3/1987 | Malhi | 357/23.6 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,686,552 | 8/1987 | Teng et al. | 357/23.6 |
| 4,704,705 | 11/1987 | Womack | 365/149 |
| 4,713,678 | 12/1987 | Womack et al. | 357/23.6 |
| 4,728,623 | 3/1988 | Lu et al. | 437/52 |
| 4,769,786 | 9/1988 | Garnache et al. | 365/182 |
| 4,791,463 | 12/1988 | Malhi | 357/23.6 |
| 4,797,373 | 1/1989 | Malhi et al. | 437/60 |
| 4,801,988 | 1/1989 | Kenney | 357/23.6 |
| 4,816,884 | 3/1989 | Hwang et al. | 357/23.6 |
| 4,824,793 | 4/1989 | Richardson et al. | 437/47 |
| 4,824,795 | 4/1989 | Blanchard | 437/99 |
| 4,829,017 | 5/1989 | Malhi | 437/47 |
| 4,830,978 | 5/1989 | Teng et al. | 437/52 |
| 4,833,094 | 5/1989 | Kenney | 437/47 |
| 4,845,537 | 7/1989 | Nishimura et al. | 357/23.4 |
| 4,845,539 | 7/1989 | Inoue | 357/23.6 |
| 4,864,374 | 9/1989 | Banerjee | 357/23.6 |
| 4,873,205 | 10/1989 | Critchlow et al. | 437/200 |
| 4,907,047 | 3/1990 | Kato et al. | 357/23.6 |
| 5,013,680 | 5/1991 | Lowrey et al. | 437/52 |
| 5,087,588 | 2/1992 | Shimizu et al. | 437/60 |
| 5,100,823 | 3/1992 | Yamada | 437/52 |
| 5,208,657 | 5/1993 | Chatterjee et al. | 257/302 |
| 5,225,697 | 7/1993 | Malhi et al. | 257/302 |
| 5,365,097 | 11/1994 | Kenney | 257/302 |

FOREIGN PATENT DOCUMENTS

| | | |
|---|---|---|
| 61-184867 | 9/1986 | Japan . |
| 63-228665 | 10/1988 | Japan . |

OTHER PUBLICATIONS

V.J. Silvestri, J. Electrochem Soc., 133(11)(1986)2374, "Growth Kinematics of a Poly Trench Refill Process" Nov. 1986.

S. Wolf, "Silicon Processing for the VLSI Era" vol. II, p. 51 Jun. 1990.

J.O. Borland et al., Sol. St. Technol. Aug.–1995, p. 141 "Advanced dielectric isolation through SEG techniques" Aug. 1985.

(List continued on next page.)

*Primary Examiner*—Charles L. Bowers, Jr.
*Assistant Examiner*—Leon Radomsky
*Attorney, Agent, or Firm*—Heslin & Rothenberg, P.C.

[57] ABSTRACT

Vertical epitaxial SOI transistors and memory cells are disclosed. The devices are formed completely within a substrate trench and have a bulk channel epitaxially grown on an exposed surface of the substrate within the trench. The bulk channel is disposed proximate to a transistor gate electrode such that an inversion layer is formed therein when the gate electrode is appropriately biased. Back biasing of the bulk region is accomplished through the substrate. In the transistor embodiment, a first node diffusion and a second node diffusion are disposed at opposite ends of the bulk channel. In a memory cell configuration the access transistor is disposed above a trench storage node, which electrically connects with the transistor's second node diffusion. Arrays of the trench transistors and trench memory cells are also described. Further, fabrication methods for the various structures disclosed are presented. A novel wiring approach to construction of bit lines in a cell array is also set forth.

10 Claims, 13 Drawing Sheets

OTHER PUBLICATIONS

S. Wolf & R.N. Tauber, "Silicon Processing for the VLSI Era", vol. I, pp. 155–156 1986.
S. Wolf, "Silicon Processing for the VLSI Era", vol. II, pp. 59–63 1990.
Jambotkar, "Compact One–Device Dynamic RAM Cell with High Storage Capacitance", IBM Technical Disclosure Bulletin, vol. 27, No.2 pp. 1313–1320, 1984.
Smeltzer, "Epitaxial Deposition of silicon in Deep Grooves", Solid–State Science and Technolgy, vol. 122, No. 12, pp. 1666–1671, 1975.
El–Kareh et al., "CMOS Inverter Structure",IBM Technical Disclosure Bulletin, vol. 27, No. 12, pp. 7046–7048, 1985.
Richardson et al., "A Trench Transistor Cross–Point DRAM Cell", IEEE, pp. 714–717, 1985.
Rao et al., "Trench Capacitor Design Issues in VLSI DRAM Cells", IEEE, pp. 140–143, 1986.
Bergendahl et al., "Self–Aligned Polycide Bit Line Structure", vol. 30, No. 12, pp. 109–110, 1988.
Bronner et al., "Epitaxy Over Trench Technology for ULSI DRAMs", 1988 Symposium on VLSI Technology —Digest of Technical Papers, pp. 21–22, 1988.
Lu et al., "Three–Seminsional Single–Crystal Dynamic RAM Cell", IBM Technical Disclosure Bulletin, vol. 31, No. 12, pp. 302–305, 1989.
Lu et al., "Vertical Conducting Connection to a Poly–Si Tench in Si", IBM Technical Disclosure Bulletin, vol. 31, No. 12, pp. 310–312, 1989.
Kenney, "Spacer–Defined Strap", IBM Technical Disclosure Bulletin, vol. 32, No. 4B, pp. 321–322, 1989.
Kenney, "Post Diffusion Insulation", IBM Technical Disclosure Bulletin, vol. 32, No. 5B, pp. 384–385, 1989.
"Trench–Based Memory Cell Storage Node Dielectric Protection During Reactive Ion Etch of a Trench Bottom", IBM Technical Disclosure Bulletin, vol. 29, No. 3, pp. 1347–1348, 1986.
Kubota et al., "A New Soft–Error Immune DRAM Cell With A Transistor on Lateral Epitaxial Silicon Layer (Tote Cell)", IEEE, pp. 344–347, 1987.

METHOD OF FABRICATING VERTICAL EPITAXIAL SOI TRANSISTOR

TECHNICAL FIELD

The present invention relates in general to integrated semiconductor circuits formed in trench structures, and more particularly, to vertical epitaxially grown SOI transistors and memory cells disposed completely within a substrate trench structure and to associated fabrication methods.

BACKGROUND ART

As the integrated circuit industry continues to explore techniques to pack more circuits onto a given semiconductor substrate, more and more thought is devoted to not only orienting the various devices in planar fashion along the surface of the substrate, but also to orienting the devices vertically either by building devices up from the substrate surface or by burying devices in trenches formed within the face of the semiconductor body. The open literature is replete with patents and articles which attest to this trend.

Parallel with an exponential growth in the use of integrated circuits has been the development of numerous types of semiconductor memory devices. Advancements in semiconductor technology have made possible memory chips with over a million locations for storing bits of data information. While each generation of memory chips continues to quadruple the number of available storage locations, the size of the integrated circuit chip must yet be maintained within certain limits to enhance production yield and accommodate conventional packaging schemes.

One common memory cell employed in large monolithic integrated memory chips comprises a dynamic random access memory (DRAM) wherein a bit is represented by a charge stored in a capacitor structure. A majority of DRAMs are fabricated using metal-oxide silicon field-effect transistor (MOSFET) technology. With appropriate voltage adjustments, these circuits can be reduced in area simply by scaling to a smaller dimension. Specifically, all dimensions of the various process masks can be uniformally shrunk so that the resulting circuitry is fabricated in a smaller area on the wafer. The scaling of a MOSFET circuit is effective to reduce the wafer area accommodated by the circuit, i.e., within certain limits.

One obvious limitation on scaling of an integrated circuit is the photolithographic technique used to form and maintain registration of the various masks. Another limitation to fabricating denser DRAM cells is that the capacitance of the storage capacitor must be of at least a specified value. With sufficient capacitance, a charge can be stored in the capacitor and later recovered as a signal of sufficient magnitude to be detectable over noise and other electrical interference. Also, the capacitance of the storage capacitor must be of sufficient value so that memory refresh cycle times do not become appreciable in comparison with normal read and write operations of the memory.

Many different types of semiconductor trench and storage capacitor constructions have been proposed in the art, all aimed at reducing cell size of DRAMs and other circuit components without compromising performance of the circuit. One approach taken in the art to conserving semiconductor wafer area is to form the capacitor storage element under a surface fabricated transistor of the cell. This is accomplished by forming a V-groove in the surface of the substrate, forming the cell transistor in the inclined face of the V-groove, and the capacitor thereunder. This type of device is commonly referred to as a V-MOS device. While the V-groove type device is effective in conserving substrate space, difficulties are encountered in masking and fabricating the irregular contour of the V-groove device.

Another memory cell approach taken in the art is partially depicted in FIG. 1. This DRAM memory cell includes a trench in a silicon substrate "Si" within which a capacitor plate "Poly Node" is formed, along with an isolation oxide "$SiO_2$". Selective silicon epitaxy "Epi Si" is then overgrown to bury the DRAM storage trench. A difficulty with the approach, however, is that as cell density increases (e.g., 64 megabit and greater memory arrays), the technique requires an epi thickness which will result in more lateral epi growth than space allows. With sufficient lateral overgrowth the required self-aligned opening to the buried node ("Poly Node") is lost.

Since trench technology is still developing, a need exists for additional trench structures, particularly new multiple device type trench structures which facilitate fabrication of extremely high density integrated circuits.

DISCLOSURE OF INVENTION

Briefly summarized, in one aspect of the present invention a vertical transistor formed completely within a substrate trench is provided. The vertical transistor includes a gate electrode and a bulk channel disposed proximate thereto within which an inversion layer is formed when the gate electrode is appropriately biased. The bulk channel is disposed directly on the trench sidewall and is electrically connected to the substrate for receiving a back biasing potential through the substrate. The transistor also includes a first node diffusion and a second node diffusion disposed at opposite ends of the bulk channel. In the described embodiment, the bulk channel is formed by growing laterally inward an epitaxial layer directly on the substrate trench sidewall. Further specific details of a vertical transistor embodiment are also described.

In another basic aspect of the present invention, a memory cell formed in a substrate trench is described. The substrate trench has a sidewall, an upper portion and a lower portion. A capacitive storage node is formed in the lower portion of the trench and an access transistor is formed in the upper portion. Both the trench capacitor and the access transistor reside entirely within the substrate trench. The transistor includes a gate electrode and a bulk channel disposed proximate thereto within which an inversion layer is formed when the transistor is appropriately biased. The bulk channel is disposed directly on the substrate trench sidewall and is therefore in electrical contact with the substrate for receiving a back biasing potential through the substrate. In the described embodiment, the bulk channel is epitaxially grown from an exposed portion of the substrate trench sidewall. Further details of this invention aspect are also presented.

In addition, methods for fabricating the various devices described are set forth. In a first method, a technique for fabricating a vertical epitaxial SOI transistor in a composite substrate having a buried contact therein is described. The method includes: forming a trench in the composite substrate which extends from an upper surface of the substrate to the buried contact; and fabricating a transistor to reside entirely within the trench by forming a lower node of the transistor in a lower portion of the trench so as to be electrically coupled to the buried contact region of the composite substrate, growing epitaxial material on the exposed trench sidewall in the upper portion of the trench such that the direction of epitaxial growth is laterally inward towards a center region of the trench, this epitaxial material defining a bulk region of the transistor, forming an upper node of a transistor within an upper end of the epitaxially grown material, and forming a gate electrode in a center region of the upper trench portion proximate the bulk region such that when the gate electrode is appropriately biased an inversion layer extending between the lower node and the upper node is formed in the bulk region near the gate electrode. Numerous process enhancements are set forth herein.

In yet another aspect of the present invention, a method for fabricating a memory cell in a monocrystalline substrate is presented. This method includes the steps of: forming a trench in the substrate; fabricating a storage node in a lower portion of the trench; fabricating an access transistor in an upper portion of the trench by growing monocrystalline epitaxial material on an exposed trench sidewall in the upper portion of the trench such that the direction of growth is substantially laterally inward towards a center region of the trench, the epitaxial material grown on the exposed trench sidewall comprising a bulk region of the access transistor and being directly electrically connected to the monocrystalline substrate for receiving a back biasing potential therefrom, and forming a gate electrode in the center region of the upper trench portion proximate the bulk region such that when the gate electrode is appropriately biased an inversion layer forms in the bulk region. In addition to providing further memory cell fabrication details, a method for constructing an interconnected array of such memory cells is also discussed.

In still another aspect, the present invention sets forth a method for fabricating two separate conductors each of which interconnects cells in a separate one of two adjacent rows of cells in an array. Each cell in the array structure is disposed at a minimum lithographic dimension relative to adjacent cells in the array. The two separate conductors are fabricated such that both are disposed between the same two adjacent cell rows. The method includes the steps of: forming a polygonal-shaped opening in an upper dielectric of the array structure between the two adjacent rows of cells such that a contact node in each cell of the two adjacent rows is exposed along a sidewall of the trench; forming a layer of metallization within the polygonal-shaped trench disposed only on the sidewall of the trench; and disconnecting the sidewall metallization at each end of the two rows such that two discrete sidewall metallization lines are defined, each of the metallization lines comprising one of the two separate conductors. Each conductor interconnects the cells in one of the two adjacent rows of cells formed at the minimum lithographic dimension. Thus, the minimum lithographic dimension is effectively exceeded thereby establishing greater device density.

The trench structures and fabrication methods presented herein, which are all readily implementable with present technology, result in extremely high density cells, thereby further advancing the state of the integrated circuit art. A transistor bulk region is epitaxially formed on an exposed sidewall of the semiconductor trench such that the bulk region is integral with the substrate for receiving a back biasing signal therefrom. A portion of grown epitaxial material (that portion forming one of the nodes of the transistor) is isolated from contact with the substrate thereby ensuring containment of the transistor within the vertical sidewall of the substrate trench. Various structures for containing device diffusions within the trench are presented. Further, these structures presented are susceptible to continuous processing using a single lithographic mask. A novel technique is presented for fabricating, for example, two bit lines within a minimum lithographic distance in a memory cell array. The wiring technique could be readily implemented in other type structures as Well, e.g., CMOS SRAMs or CMOS inverters. All of the structures and methods presented are readily adaptable to mixing with conventional planar fabricated structures as desired. A dual storage node structure and fabrication technique is also described for enhancing the signal storage capability of each cell.

BRIEF DESCRIPTION OF THE DRAWINGS

These and other objects, advantages and features of the present invention will be more readily understood from the following detailed description of certain preferred embodiments of the present invention, when considered in conjunction with the accompanying drawings in which.

Figure 13A:
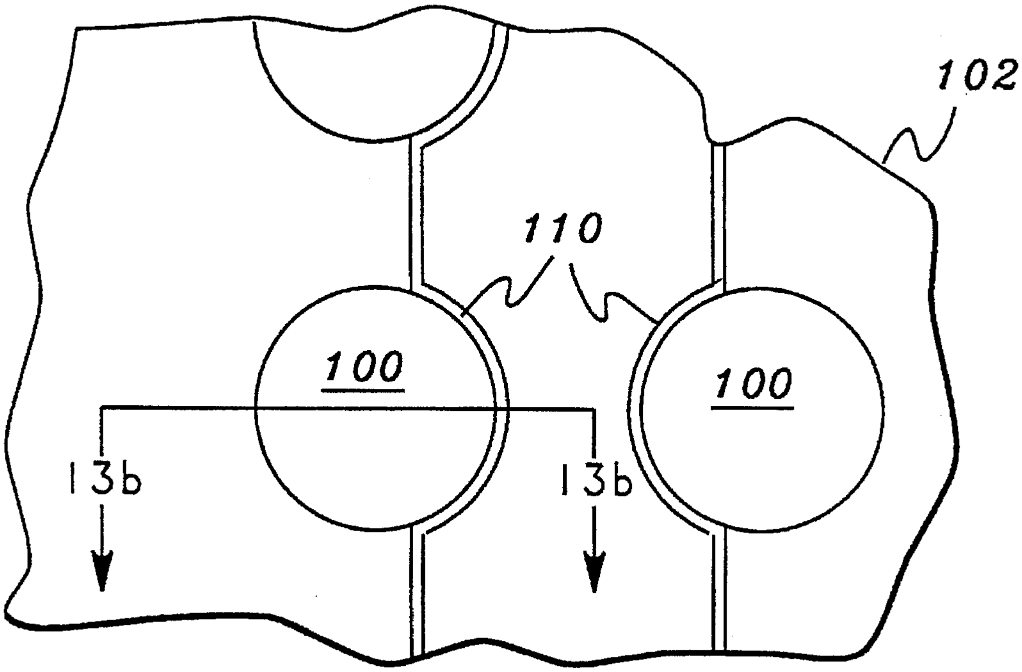
Figure 13B:
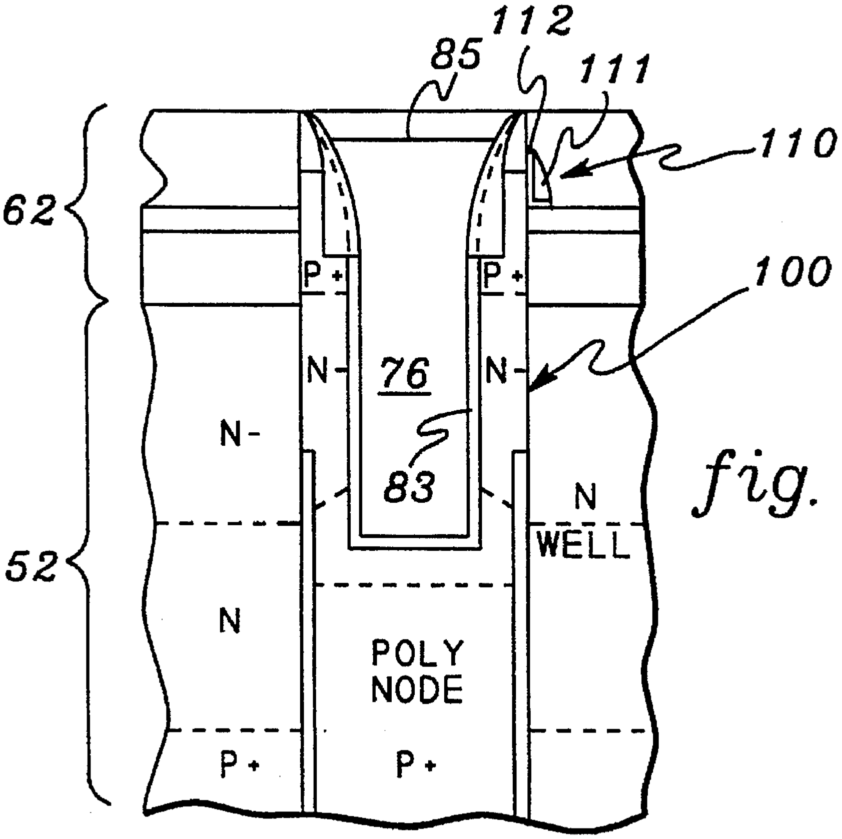

FIG. **13*a*** is a partial plan view of a memory cell array and a bit line structure pursuant to the present invention;

FIG. **13*b* is a cross-sectional view of the memory cell array and bit line structure of FIG. 13*a* taken along line 13*b*—13*b*;**

Figure 14:
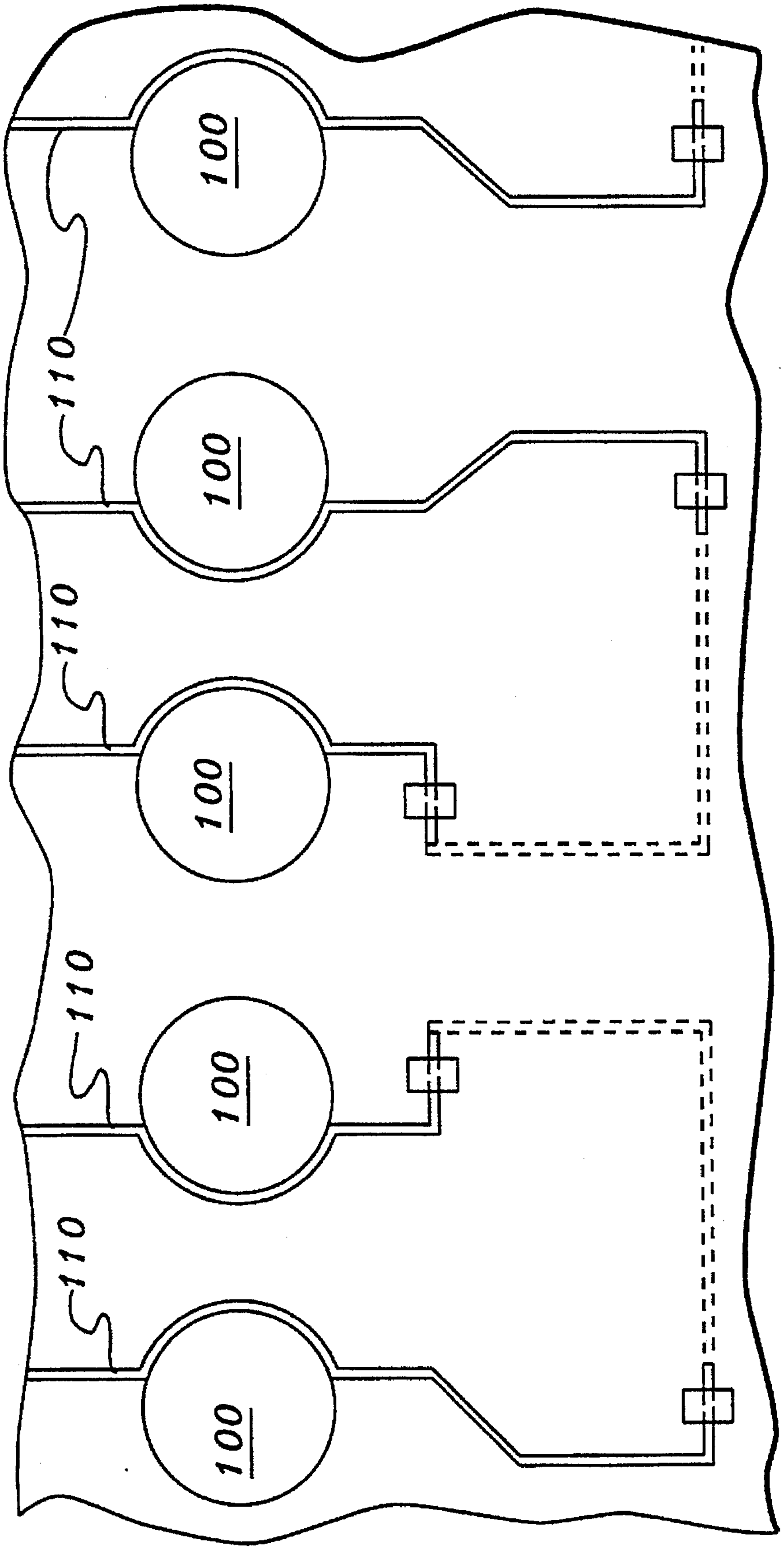
Figure 15:
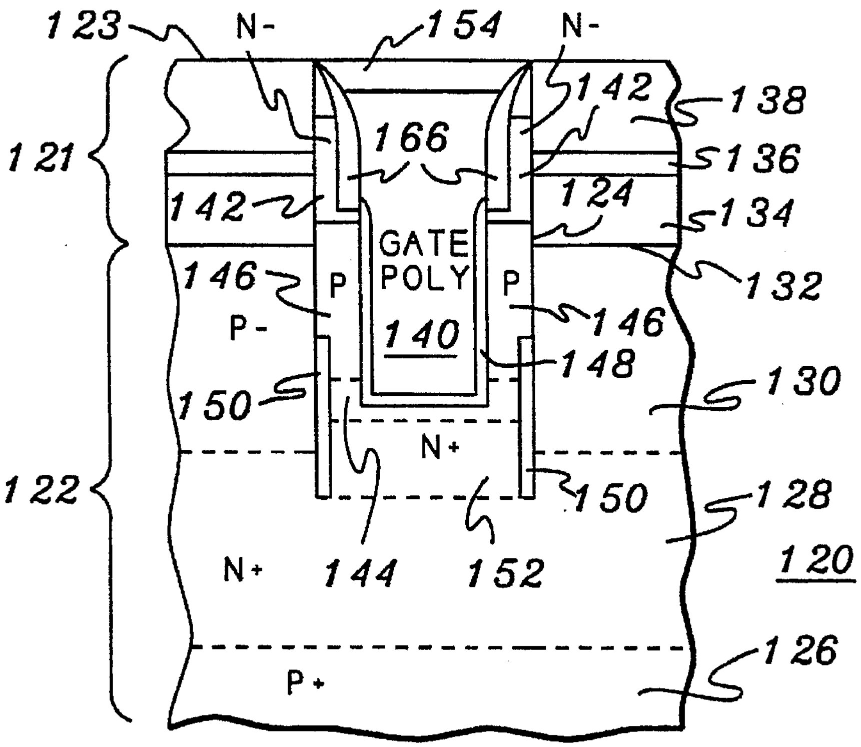
Figure 20:
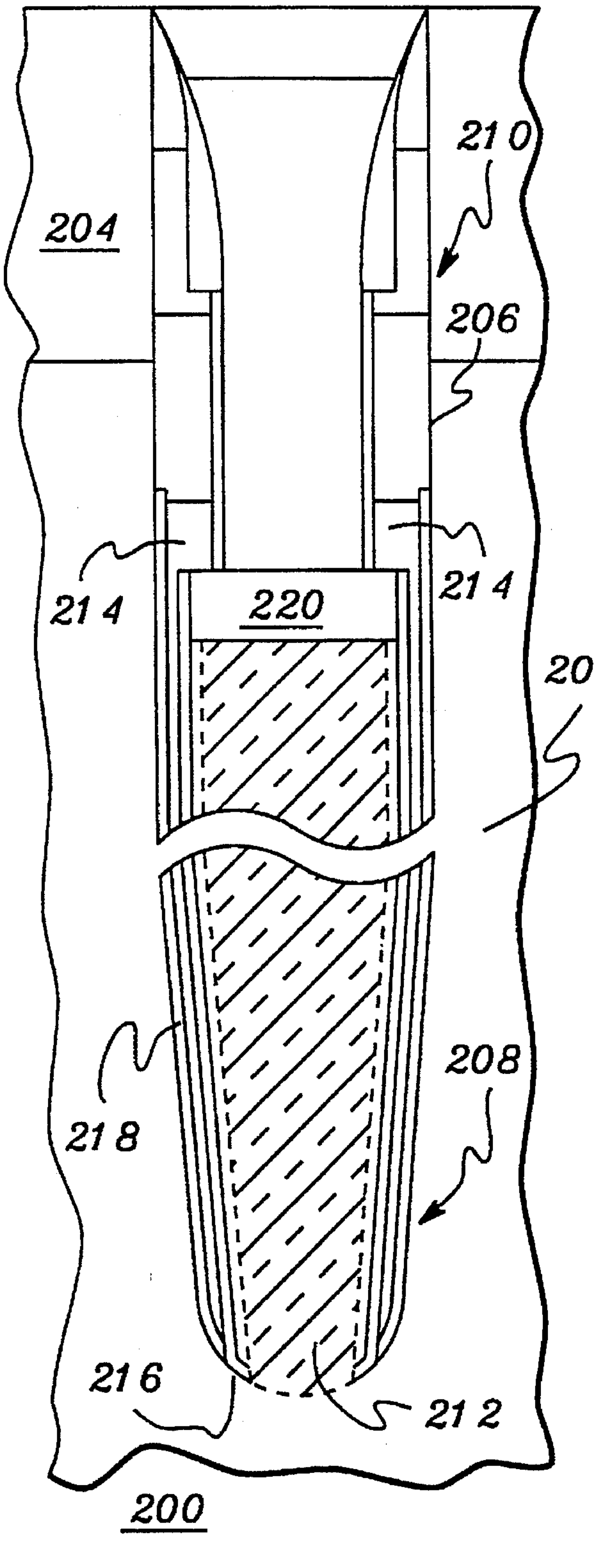

FIG. 14 is a partial plan view of one wiring embodiment pursuant to the present invention for a memory cell array;

FIG. 15 is a cross-sectional view of one embodiment of a field effect transistor (FET) device pursuant to the present invention;

FIGS. 16, 17, 18 & 19 are cross-sectional views of the FET device illustrated in FIG. 15 taken during successive steps in a fabrication process pursuant to the present invention;

FIG. 20 is a cross-sectional view of one embodiment of a dual storage memory cell pursuant to the present invention; and FIGS. 21, 22, 23, 24 & 25 are cross-sectional views of the cell illustrated in FIG. 20 taken during successive steps in a fabrication process pursuant to the present invention.

BEST MODE FOR CARRYING OUT THE INVENTION

In the following description and accompanying drawings the same reference numbers are used throughout multiple figures to designate the same or similar components.

Figure 1:
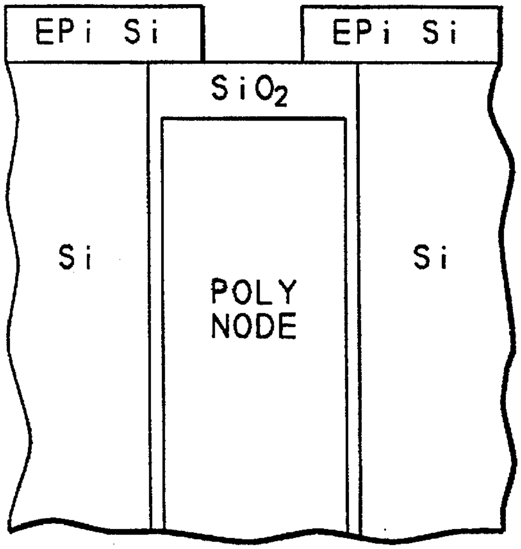
FIG. 1 is a cross-sectional view of a portion of a dynamic memory cell.
Figure 2:
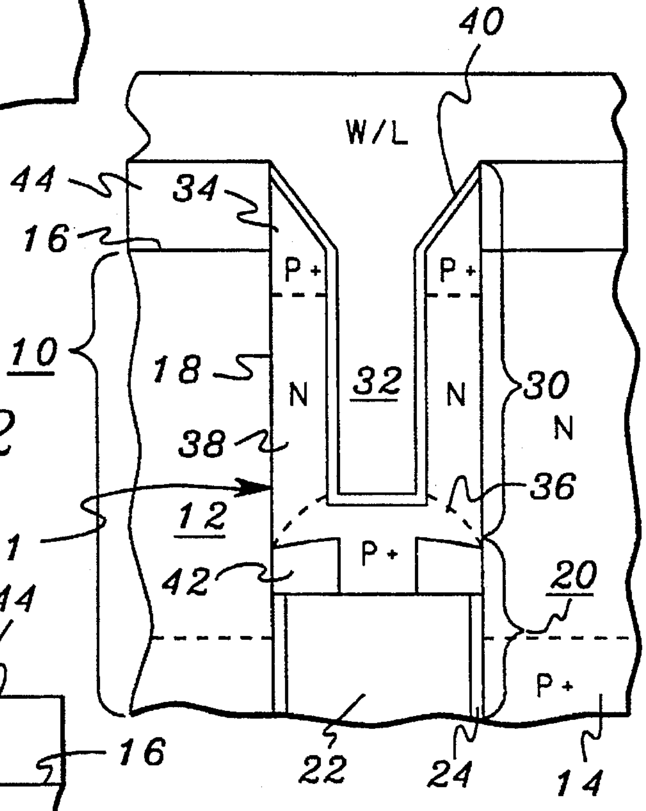
FIG. 2 is a cross-sectional view of one embodiment of a dynamic memory cell pursuant to the present invention.

A basic embodiment of a dynamic memory cell 11 pursuant to the present invention is shown in FIG. 2. Memory cell 11 is formed in a composite semiconductor substrate 10 in which an N-well 12 exists within a P− epitaxial layer (not shown) grown above a P+ substrate portion 14. Formed from an upper surface 16 of substrate 10 is a trench 18 extending vertically into the substrate so as to pass through N-well portion 12 into P+ substrate portion 14. A lower portion of trench 18 (only partially shown) contains a storage capacitor 20 which may, for example, comprise a polycrystalline material 22 (such as polysilicon) isolated from the inner wall of trench 18 by a thin node dielectric 24.

An upper portion of trench 18 contains a field effect transistor (FET) 30 having a gate 32, a first node (source/drain) diffusion 34 and a second node (drain/source) diffusion 36. This cell access transistor 30 includes a vertically extending layer 38 of monocrystalline epitaxial material disposed along the sidewall of trench 18. Epi layer 38 comprises a bulk channel of semiconductive material within which an inversion layer forms when the transistor, and in particular gate 32, is appropriately biased. In this embodiment, epitaxial layer 38 is of N conductivity type, while node diffusions 34 & 36 are of P+ conductivity material (thereby defining a P channel transistor). Gate 32 is separated from epitaxial layer 38 via a gate dielectric 40, such as a thin gate oxide. A ring of dielectric material 42 separates trench capacitor 20 in the lower portion of trench 18 from FET 30 in the upper portion of the trench.

In an array configuration containing multiple memory cells, source/drain diffusion 34 is connected to one of a plurality of bit/sense lines (not shown), while gate 32 is connected to one of a plurality of word lines (W/L), which typically run orthogonal to the plurality of bit/sense lines. A dielectric material, such as silicon oxide, forms an isolation layer 44 on the upper surface 16 of substrate 10 to accommodate proper isolation of the orthogonal running conductors.

To store a binary digit in the storage capacitor, i.e., trench capacitor 20, a high or a low voltage is applied to the bit/sense line (not shown), which is connected to source/drain diffusion 34, and the transistor is turned on to charge the storage node if a high voltage is applied to the bit/sense line (indicating, e.g., the presence of a one digit), otherwise the storage node remains uncharged (indicating the presence of a stored zero digit). To read information from the storage capacitor, the bit/sense line is charged to a high voltage and the transistor is turned on. If the bit/sense line is discharged (i.e., by the downward movement of carriers through epitaxial layer 38) a sense amplifier (not shown) connected to the bit/sense line will indicate the presence of a zero digit in the storage capacitor. By comparison to a reference cell, if the bit/sense line remains charged the storage capacitor contains a high charge, i.e., is storing a one digit.

By way of providing a specific size example, using current technology a cell may be approximately one half square micron in area (e.g., 0.7 μm ×0.7 μm in size). With such a dimension, the trench size would be approximately 0.35 μm in diameter, with the thickness of epitaxy 38 being approximately 500 angstroms and gate dielectric 40 approximately 100 angstroms. An example of an appropriate vertical channel length for bulk region 38 extending between diffusions 34 & 36 is 0.5 μm, while an acceptable thickness for node dielectric 24 would be in the range of 50–100 angstroms.

The depicted memory cell 11 illustrates several advantages of the present invention over previous dynamic memory cell configurations. For example, the epitaxially grown bulk region or channel within which the gate inversion layer is generated is vertically oriented within the trench and in direct contact with N-well 12 of composite substrate 10. Thus, accurate substrate back biasing of the bulk region is possible to better control the turn-on/turn-off characteristics of FET 30. In addition, the entire dynamic memory cell (i.e., storage node and access transistor) resides within trench 18 formed in substrate 10 (including all lateral epi growth) and the entire structure can be formed from a single mask (i.e., the initial trench mask) since all structures are self-aligned within the trench opening. Further, and as explained herein, other types of integrated circuit trench structures can be readily fabricated utilizing the basic vertical epitaxial silicon-on-insulator (SOI) structure presented.

One fabrication process for a trench device such as depicted in FIG. 2 is next discussed with reference to FIGS. 2–6.

Figure 3:
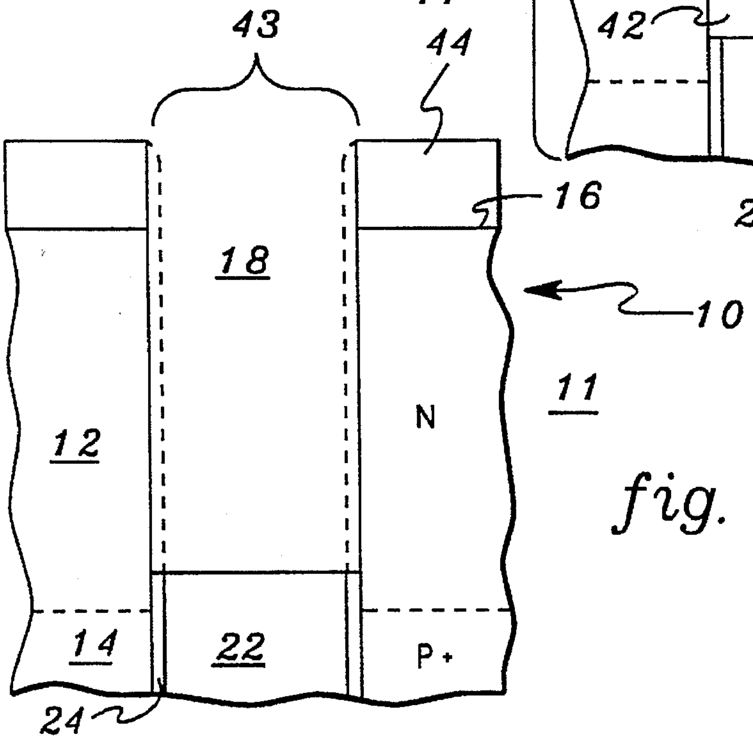
FIGS. 3, 4, 5 & 6 are cross-sectional views of the cell embodiment illustrated in FIG. 2 taken during successive steps in a fabrication process pursuant to the present invention.

Referring first to FIG. 3, processing assumes provision of a monocrystalline semiconductive substrate 10 (e.g., comprising silicon) having a first conductivity type (such as, P+ conductivity portion 14) above which a well 12 of second conductivity type material (e.g., N− conductivity) is formed from an upper surface 16 of the substrate material (or more particularly, from an upper surface of a mask 44 disposed on surface 16 of substrate 10). Dielectric material 44, such as silicon oxide ($SiO_2$), is formed and patterned to define an opening 43 through which a trench 18 is etched into the semiconductor material. Trench 18 comprises a vertical trench extending preferably through well 12 into the substrate material of first conductivity type 14.

Once trench 18 is defined, a thin conformal layer of dielectric material 24 is deposited. A storage node is then defined by filling trench 18 with polycrystalline material (e.g., polysilicon), planarizing the poly material to the surface of the original mask (i.e., the upper surface of oxide 44) and then recessing the poly to a predetermined, desired depth within the trench. By way of example, poly node 22 may be recessed below surface 16 of substrate 10 approximately 0.5 to 1.0 μm. Subsequently, the thin sidewall dielectric in the upper portion of trench 18 (i.e., above poly 22) is etched away without compromising a significant portion of the planar, masking dielectric 44 disposed above substrate 10. The resultant structure comprises a vertical node structure with the node polysilicon recessed appropriately below the silicon's upper surface.

Figure 4:
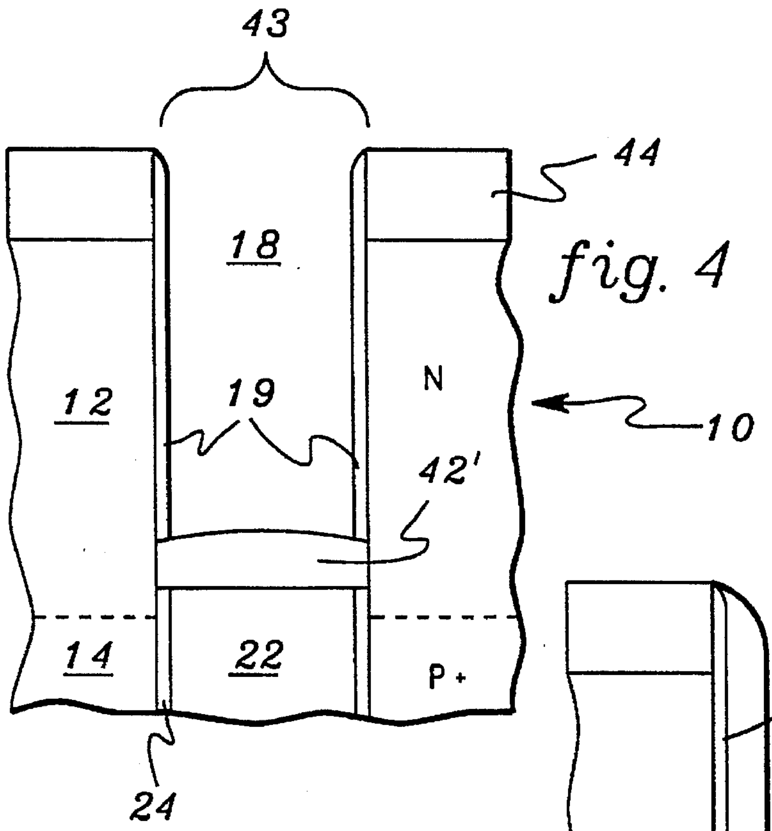

As depicted in FIG. 4, a thin silicon nitride ($Si_3N_4$) layer is thereafter conformally deposited over the exposed surfaces of the assembly of FIG. 3 and RIE etched to form nitride spacer 19 located only on the vertical sidewall of trench 18. If desired, a thin oxide (not shown) could be predisposed beneath silicon nitride layer 19 to protect the monocrystalline silicon substrate from damage by the nitride layer. The top of polysilicon node 22 is next effectively capped by a thermally grown oxide material 42' of predesired thickness. Ring 42, shown in FIGS. 2, 5 & 6, will ultimately be defined from oxide material 42'.

Figure 5:
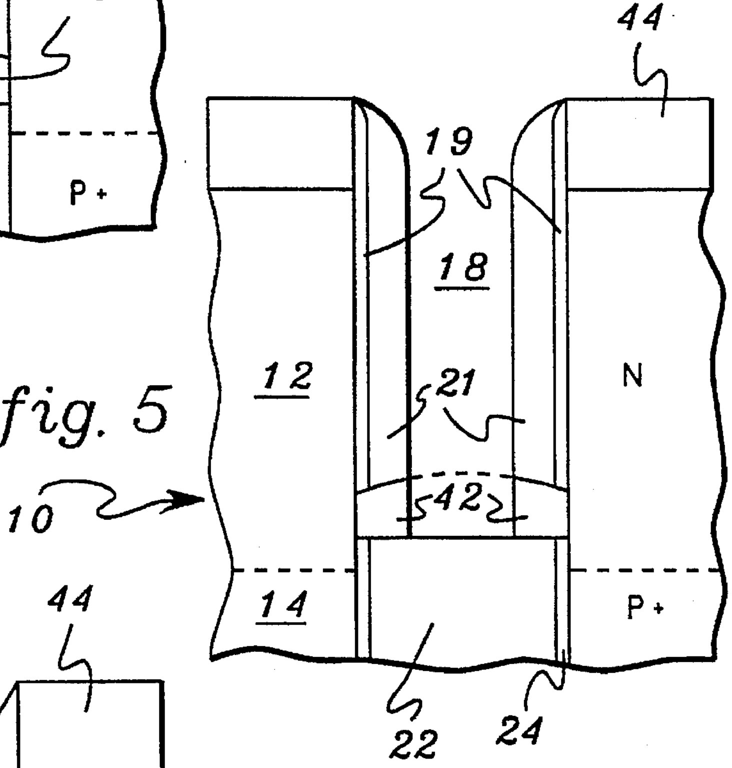

Referring to FIG. 5, a conformal spacer layer 21 (fabricated, e.g., of parylene) is next deposited and RIE etched (e.g., in an oxygen plasma) to define vertical sidewall spacer 21 overlying silicon nitride layer 19 within trench 18. Vertical spacer 21 is of sufficient thickness to define a desired radial width for ring oxide 42, which results from only etching cap oxide 42' from the upper surface of node 22 near the center portion of trench 18. The resultant oxide ring 42 must be sized to provide spacing between the polycrystalline node and the monocrystalline substrate sidewall surface in the upper portion of trench 18 during the subsequent epitaxial growth process (discussed below). The trench sidewall surface 37 is next exposed by removing spacer 21 (by plasma oxygen processing) and then thin nitride spacer 19 (for example, in phosphoric acid at approximately 150° C.).

Figure 6:
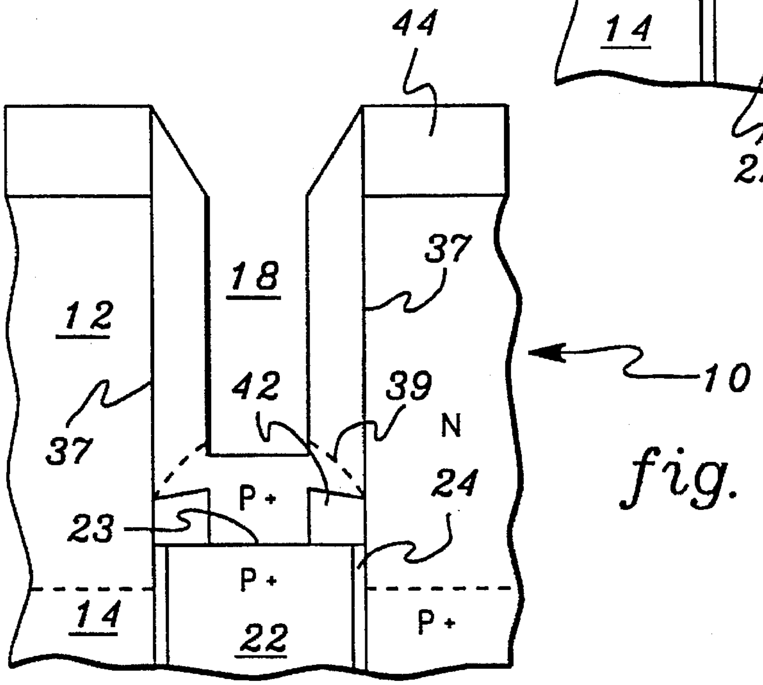

After the sidewall spacers have been removed, epitaxial growth within trench 18 can be commenced. (For filling a trench with epi reference an article by R. K. Smeltzer, entitled: "Epitaxial Deposition of Silicon in Deep Grooves," J. Electro. Soc., Vol. 122, No. 12, pp. 1666–1671 (Dec., 1975).) As shown in FIG. 6, the starting nucleating surfaces comprise the exposed monocrystalline sidewall surface 37 in the upper portion of trench 18 and the exposed polycrystalline top surface 23 of node 22. These different nucleating surfaces are separated by oxide ring 42, which must be of sufficient thickness to first ensure that no upward growing polycrystalline epi significantly interferes with the lateral single crystal growth, and second that no upward diffusion of dopant (such as boron, or in a complementary device, phosphorus or arsenic) out of heavily doped poly node 22 should reach beyond the boundaries of trench 18. The processing goal is to maintain the junction boundary 39 within the monocrystalline epitaxy within the boundaries of trench 18. Again, single crystal growth propagates substantially horizontally into the trench from exposed monocrystalline sidewalls 37 of N-well portion 12, while polycrystalline growth propagates substantially vertically upward from the exposed upper surface of poly node 22.

The diffusion of dopant from polysilicon node 22 into the polycrystalline epitaxial growth may either comprise part of the epitaxial growth process or, if epitaxy occurs at a sufficiently low temperature, as a separate thermal cycle. In practice, epitaxial growth will probably comprise a timed growth conducted based upon empirically available data. (A large empirical database exists in the open literature for epitaxy growth times and temperatures.) In this first process embodiment, lateral epitaxial growth is terminated prior to filling the entire upper portion of trench 18, i.e., epitaxial growth is stopped with a center region of trench 18 remaining open as shown in FIG. 6.

Fabrication processing of the dynamic memory cell continues with a photoresist or parylene material filling the remaining trench 18 opening, after which the material is patterned and etched such that only the upper edges of the epitaxially grown layer are exposed. Next, ion implantation of doping material can occur to define the first or upper diffusion node followed by removal of the photoresist (or parylene) material. A gate oxide 40 is then formed on the exposed surfaces of the epitaxial layer, followed by the formation of gate 32 (e.g., of polysilicon material), which can be simultaneously formed integral with the word line conductors ((W/L) in FIG. 2) in a memory array of a plurality of memory cells such as that described below. Self-aligned polygate 32 completes the pass device vertically. The bit lines (not shown) must also then be connected to the bit/sense diffusion 34 in the upper portion of epitaxial grown layer 38. (One approach to fabricating a bit line is presented below in connection with the memory cell array of FIGS. 13*a*–*14*). A small bit line cross-section is preferred to minimize bit line capacitance. Note that planar silicon oxide 44 will confine source/drain diffusion 34 to the upper vertical epitaxial region, thereby 5 helping to further reduce bit line capacitance.

A more complex dynamic memory cell 50 pursuant to the present invention is next described with reference to FIG. 7.

Figure 7:
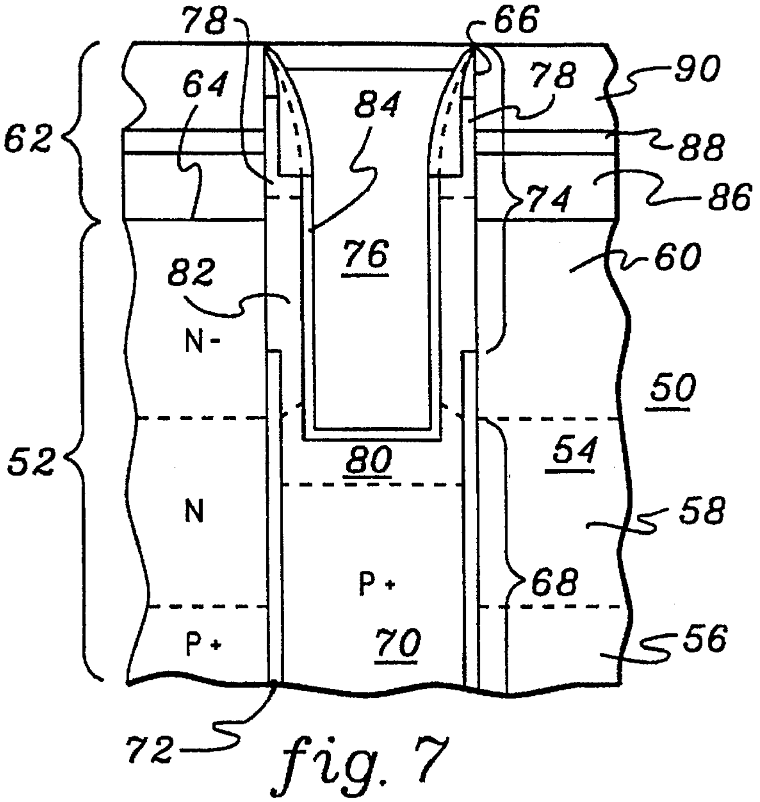
FIG. 7 is a cross-sectional view of another embodiment of a dynamic memory cell pursuant to the present invention.

Referring first to FIG. 7, cell 50 comprises a more exactingly fabricated (and, therefore, effective) vertical epitaxial SOI device. This cell is again formed in a composite semiconductor substrate 52 having an N-well 54 disposed above a P+ substrate portion 56. N-well 54 is further subdivided into an N conductivity type transition region 58 and an N− conductivity region 60 adjacent an upper surface 64 of composite substrate 52. A multi-layer mask 62 is disposed above upper surface 64 of substrate 52. A trench 66 extends vertically through mask 62 into substrate 52 sufficiently to pass through N-well portion 54 into P+ substrate portion 56.

As with the dynamic memory cell embodiment of FIGS. 2–6, a lower portion of the trench contains a storage capacitor 68, comprising a polycrystalline storage node 70 (e.g., consisting of polysilicon) isolated from substrate 52 by a thin node dielectric 72. An upper portion of trench 66 contains field effect transistor (FET) 74 having a gate 76, a first node (source/drain) diffusion 78 and a second node (drain/source) diffusion 80. Transistor 74 includes a vertically oriented layer 82 of monocrystalline epitaxial material disposed along the upper portion of the trench sidewall in direct contact with the composite substrate. Material 82 defines a bulk channel within which an inversion layer is formed when gate 76 is appropriately biased, to allow transfer of charge between diffusion regions 78 & 80. As in the first-described embodiment, epitaxial layer 82 is N conductivity type, while node diffusions 78 and 80 are of P+ conductivity material. Gate 76 is separated from epitaxial layer 82 by a dielectric 84, such as a thin gate oxide.

In a memory array configuration containing multiple such memory cells 50, source diffusions 78 are connected to a bit/sense line (discussed below), while gate 76 is connected to one of a plurality of word lines, which conventionally run orthogonal to the plurality of bit/sense lines. The multiple mask layers 62 include a layer of silicon oxide 86 disposed on upper surface 64 of composite substrate 52, a layer of metal oxide 88 (such as $Al_2O_3$) disposed thereon and an upper layer of doped oxide 90, which in the cell fabrication process to be described below comprises the dopant source for source/drain diffusion 78.

Functionally device 50 is analogous to memory cell 11 described in connection with FIGS. 2–6. However, as will be apparent from the following fabrication discussion, the memory cell embodiment of FIG. 7 provides significantly improved leverage to contain the node diffusions within the vertical trench 66. For example, the extent of first node diffusion 78 is more easily and exactly controlled, as is the thickness of monocrystalline epitaxial material 82 on the vertical sidewall of trench 66. By the provision of relatively thick spacer oxides about first node diffusion 78 capacitive coupling between this diffusion and the gate is also limited.

A preferred fabrication process for dynamic memory cell 50 is next presented with reference to FIGS. 7–14. As will be noted, many aspects of device 50 fabrication are the same or similar to those discussed above in connection with memory cell 11 of FIG. 2.

Figure 8:
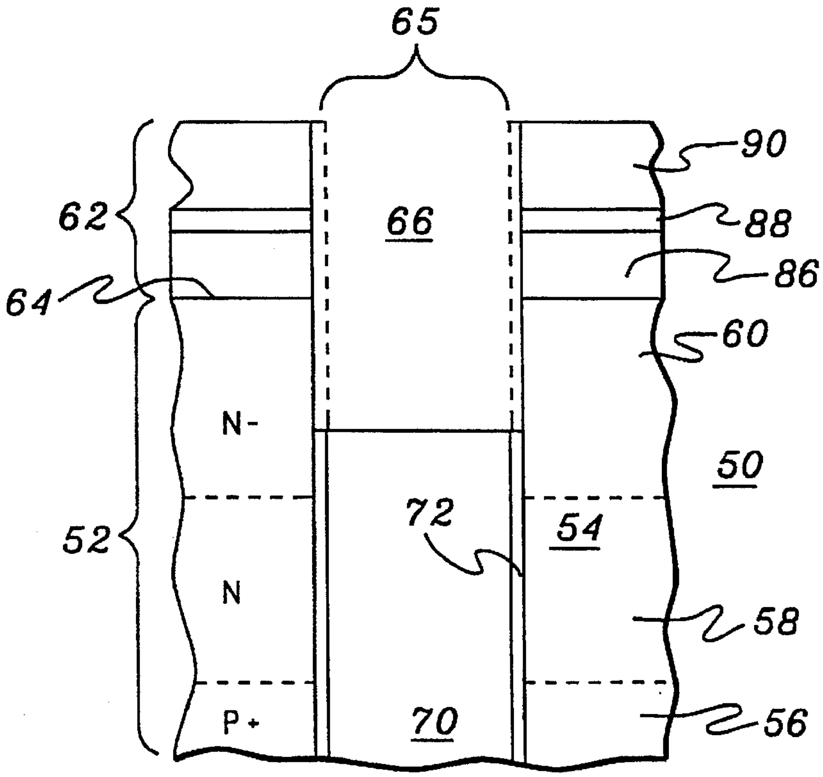
FIGS. 8, 9, 10, 11 & 12 are cross-sectional views of the cell embodiment illustrated in FIG. 7 taken during successive steps in a fabrication process pursuant to the present invention.

Referring first to FIG. 8, a monocrystalline composite substrate 52 of a first conductivity type (P+ conductivity portion 56) is provided above which an N-well 54 of a second conductivity type (N conductivity) resides, e.g., in an epitaxially grown P− material. N-well 54 comprises a retrograde structure having a more lightly doped upper region 60 in contact with a middle, more heavily doped region 58 disposed adjacent P+ substrate portion 56. A multi-layered mask 62 is formed on an upper surface 64 of substrate 52 and patterned to define an opening 65 through which a trench 66 is etched into the semiconductor material. Trench 66 comprises a vertical trench extending through well 54 into the monocrystalline substrate material of first conductivity type 56.

Mask structure 62 includes a layer of silicon oxide 86 formed on upper surface 64 of substrate 52, an aluminum oxide ($Al_2O_3$) layer 88 disposed thereon and an appropriately doped oxide layer 90 located above the metal oxide layer. For example, in the PNP device depicted in FIG. 7, oxide layer 90 can be doped with boron for a P type diffusion into a top end of the epitaxial material to be grown (see FIG. 7). Such a multi-level mask structure is preferred for this device fabrication process. For example, metal oxide layer 88 will be employed as an etch stop during formation of bit/sense line connections to the diffused nodes created in the epitaxial grown material from the dopant contained within oxide layer 90.

As in previous processing, once trench 66 is defined a thin conformal layer of dielectric material 72 is deposited. The upper portion of layer 72 (shown in phantom) is removed in subsequent processing. A storage node is defined by filling trench 18 with polysilicon material, planarizing the polysilicon to the surface of the original mask (i.e., the upper surface of multi-layer mask 62) and then recessing the polysilicon to a predetermined, desired depth within the trench. The thin sidewall dielectric in the upper portion of trench 66 is then etched away without significantly compromising the planar masking dielectric layer 90.

Figure 9:
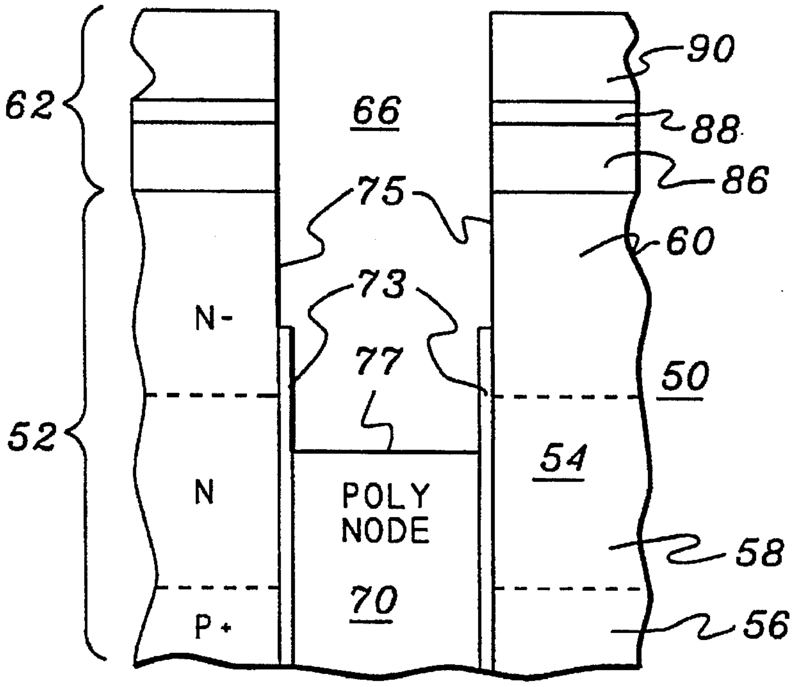

Referring to FIG. 9, the cell assembly is next RIE etched to further reduce the polysilicon fill 70 within trench 66 so that a portion 73 of sidewall dielectric 72 is exposed. This exposed dielectric 73 will perform the same function as oxide ring 42 in memory cell 11 of FIGS. 2–6. Specifically, dielectric portion 73 ensures physical separation of the nucleating surfaces for epitaxial growth, i.e., separation of monocrystalline substrate surface 75 and polycrystalline node surface 77. The extent of polysilicon recess within trench 66 depends upon the expected upward diffusion of dopant from poly node 70.

Again, physical separation is necessary to ensure that the upward diffusion of dopant from poly node 70 does not reach the exposed substrate surface 75, and that the monocrystalline growth will be such that the interface between the monocrystalline epitaxy and the polycrystalline epitaxy occurs within the trench below the upper extent of dielectric portion 73. Also, those skilled in the art will recognize that the junction edge between the monocrystalline based bulk channel and polycrystalline lower node will tend to form in the single crystalline material since dopant will extend to a certain extent into the monocrystalline structure from the polycrystalline structure. Added thermal treatment can be used to ensure that this junction edge is in the monocrystalline material. If the junction were to be formed within the poly structure then greater leakage at the junction could be expected.

Figure 10:
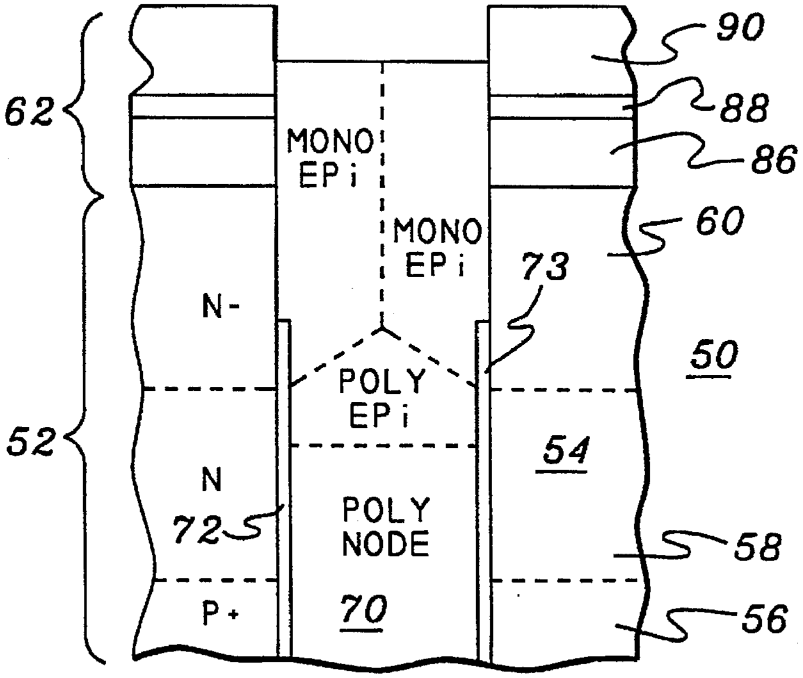
Figure 11:
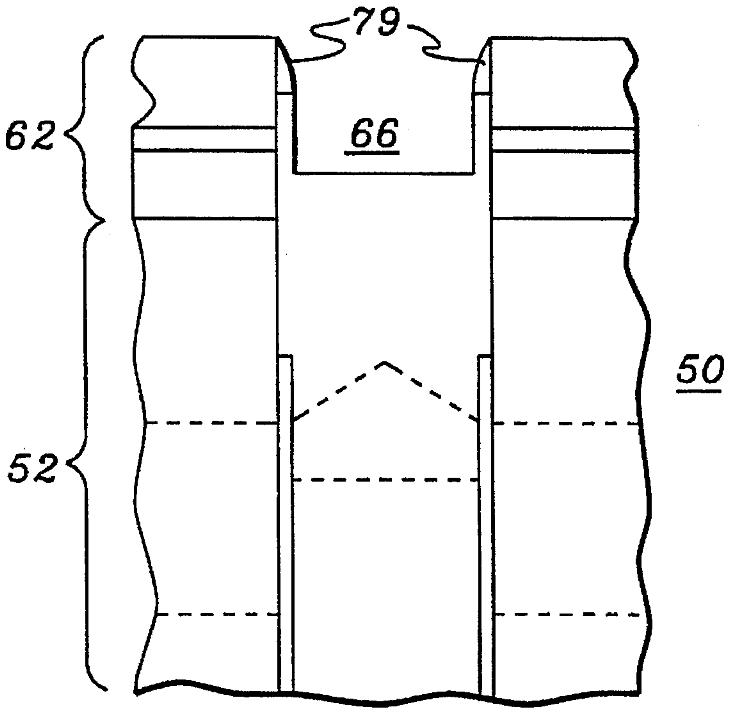
Figure 12:
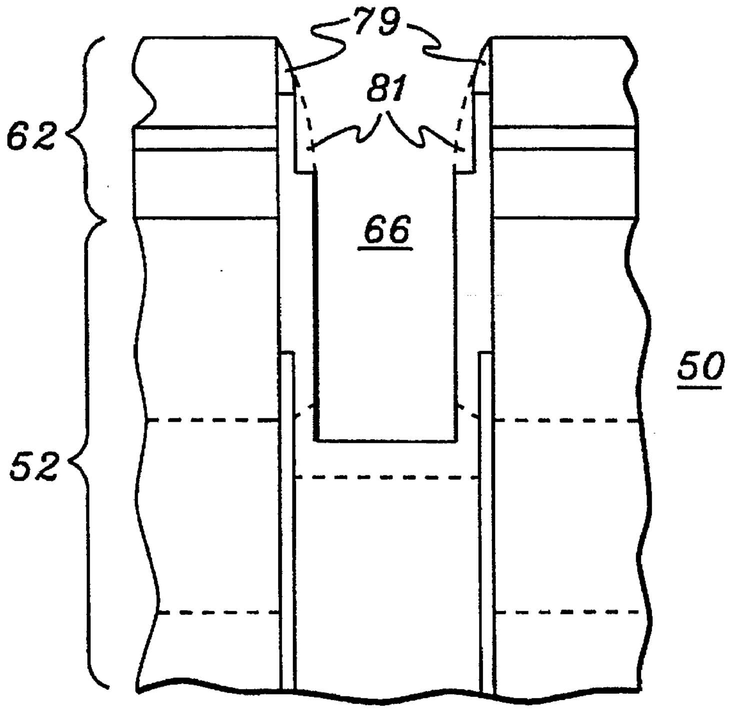

As shown in FIG. 10, trench 66 is subsequently filled with selectively grown epitaxial material, either to a certain predesired recess level as shown in FIG. 10, or sufficiently to over fill trench 66, subsequent which by polishing and etching in a manner well-known in the art a recess structure as shown would be obtained. The overfill/etch back approach is preferred since it provides a predictably flat top surface within the trench. Note that recess etching must not lower the upper surface of the epitaxy below doped layer 90, which is to serve as the source for diffusion of the upper source/drain node 78 (FIG. 7). Also note that the thickness of $SiO_2$ layer 86 is chosen such that the following described dopant diffusion from layer 90 into the monocrystalline epitaxy will not reach substrate 52.

Next, a first oxide sidewall spacer 79 (FIG. 11) is formed and the epitaxial material at the center of trench 66 is RIE etched downward a predetermined distance as shown. A second oxide sidewall spacer 81 (FIG. 12) is similarly formed, after which RIE etching of the center recess within trench 66 is completed to a desired level. Second sidewall spacer 81, which is used in part to reduce subsequent gate (word line) to bit line diffusion overlap capacitance, should also extend into trench 66 sufficiently to ensure that diffusion from doped oxide 90 will extend slightly below the spacer. As shown in FIG. 7 the last steps in fabrication of the device are to conformally deposit a gate oxide 84 on the exposed surfaces of the epitaxial layer, followed by formation of a gate 76 in the center opening in trench 66. A silicide cap 85 (such as Cobalt Silicide ($CoSi_2$)) can be used as a mask to facilitate the subsequent formation of a bit line trench and the bit/sense line, as well as to improve word line (not shown) to gate 76 electrical contact.

A memory array of vertical epitaxial SOI cells such those depicted in FIG. 7 is shown in FIGS. **13*a*–14. Two adjacent memory cells 100 are first depicted in plan view in FIG. 13*a*. Cells 100 comprise adjacent dynamic storage devices in a memory array 102, only a part of which is shown. Spacing between cells 100** is assumed to comprise a minimum, state of the art lithographic distance. (Although shown with a circular cross-section, other cell configurations are possible. For example, the trench cross-sections could be made nearly square by use of two masks for trench definition. Such square structures would have significantly increased storage capacitance.) As part of the present invention, a novel method for fabricating two bit lines within such a minimum lithographic dimension is presented, thereby attaining greater density than lithographically possible.

A polygonal-shaped bit line trench is initially formed in oxide layer 90 down to metal oxide layer 88. A metallization structure 110 is then constructed on the inner sidewall of such a trench as can be imagined from an extrapolation of the conductors in FIGS. **13*a* & 13*b*. Structure 110 preferably comprises a CVD TiN barrier layer 112 upon which is disposed a CVD tungsten layer 111, both of which are directionally etched to form conformal conductor structure 110**. Finally, the bit lines would be cut at the array edges by use of a mask and etch step (otherwise a single bit line would interconnect adjacent rows of memory cells).

FIG. 14 depicts a plan view of a trench formed bit line at such a memory cell array 102 edge, wherein the bit line portion removed from the trench is shown in phantom. The oxide trench must be formed at the edge of the array such that conventional wiring space is provided for to make electrical contact to each bit line 110 in the array. (Obviously, other bit line staggering schemes are possible.) This bit line fabrication scheme could also be used to fabricate wiring for non-cell type circuits and for SRAM cells. Those skilled in the art will recognize that, in principle, the lithographic limit has thus been stretched by producing two bit line structures within a minimum lithographic unit for adjacent structures. Further, the bit lines are self-aligned to the transistors or cells being interconnected.

It will be noted from the above discussion of FIGS. 7–14 that bulk channel length tolerance is advantageously determined pursuant to the fabrication technique presented by vertical etch tolerance, rather than the more conventional resist image tolerances. For example, an etch tolerance of ±10% for a 0.7 μm total vertical height would provide a ±0.07 μm channel length tolerance. The device width (i.e., gate 76 perimeter) would be 0.8 μm versus about 0.4 μm for a conventional planar device construction.

The above-presented selective sidewall epi technique, combined with an appropriate mask to retain dielectric on the trench sidewall as needed, could also be used to build other vertical device structures having similar features. By way of example, one embodiment of a vertical epitaxial SOI trench transistor 120 is depicted in FIG. 15. (For variety, transistor 120 is implemented as an NPN type transistor in contrast to the PNP access transistors of the DRAM memory cells depicted in FIGS. 2 & 7.) If desired, multiple vertical FETs such as that depicted in FIG. 15 (or, obviously, the complement thereof) could be combined with a DRAM array. Also, any of the vertical structures described herein could be used in combination with conventional planar technology devices simply by providing a cap oxide over the vertical cell(s) for passivation while the planar device(s) would be constructed.

Figure 16:
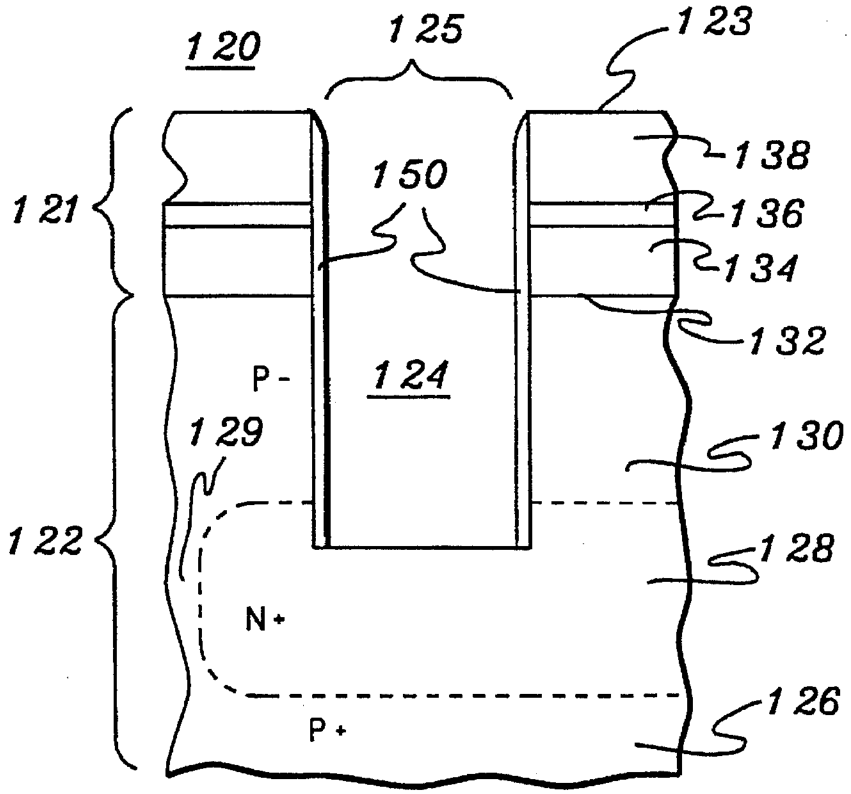

Vertical NPN transistor 120 depicted in FIG. 15 is formed within a trench 124 extending from an upper surface 123 of a multi-layer mask structure 121 into a composite semiconductor substrate 122. Substrate 122 includes a base P+ substrate portion 126, a horizontally extending buried N+ diffusion layer 128 and a P− conductivity layer 130 disposed adjacent the upper surface 132 of substrate 122. As depicted in FIG. 16, P− layer 130 is preferably in direct contact with P+ substrate portion 126 through a gap 129 in the horizontally extending N+ buried diffusion layer 128. N+ buried diffusion 128 is connected to the next transistor or the next contact point and may comprise a narrow buried line for local interconnect of one device to another or an extensive plate wherein multiple transistors reach down to the buried diffusion. As a fabrication example, composite substrate 122 could be produced by first diffusing an appropriate dopant into a P+ substrate so as to produce the N+ buried diffusion region, and secondly growing an epitaxial layer of P− conductivity material above the top surface of the buried diffusion region.

Multi-layer mask 121 is similar to the mask structure employed during fabrication of the dynamic memory cell of FIG. 7. Specifically, a dielectric layer 134 (such as silicon oxide) is formed on upper surface 132 of composite substrate 122, subsequent which a metal oxide 136 (such as $Al_2O_3$) is deposited, and an appropriate dielectric 138 is formed thereon. If desired, dielectric 138 may be doped to define the point source for the subsequently formed upper diffusion region 142 (FIG. 15) within the vertically grown trench epi as described above in connection with the dynamic memory cell of FIGS. 7–12. For a basic transistor embodiment such as that depicted in FIG. 15, trench 124 depth is a fraction (e.g., 1/5 to 1/10) of the trench depth needed to fabricate the dynamic memory cells discussed in connection with FIGS. 2–14.

The vertical transistor 120 disposed in trench 124 is very similar to access transistor 74 depicted in FIG. 7. This transistor includes a gate 140, a first node diffusion 142 (source/drain), a second node diffusion 144 (drain/source), and a bulk region or bulk channel 146. Because an NPN transistor embodiment is depicted, diffusions 142 & 144 comprise N+ conductivity regions, while bulk region 146 consists of P conductivity material. Gate 140 is separated from bulk region 146 via a thin gate dielectric 148. When the transistor is appropriately biased, an inversion layer is formed within bulk region 146 directly adjacent gate dielectric 148. As is basic to transistor technology, contemporaneous with appropriate transistor biasing, charge carriers will move vertically within the inversion layer between node diffusions 142 and 144. The direction of such carrier movement is dependent upon the biasing potentials applied to the transistor's electrodes.

A thin dielectric material 150 isolates node diffusion 144 from contacting the substrate material. An N+ monocrystalline region 152 exists in the bottom of trench 124 to connect diffusion 144 to buried layer 128, thereby allowing the application of a biasing potential to the second node diffusion. First node diffusion 142 can be contacted as already described in connection with the dynamic memory cell embodiments of FIGS. 7–14. If desired, a silicide cap 154 is disposed above gate 140, for example, to facilitate electrical connection thereto. The same metal connections must be made to the gate and to the upper diffusion as in the embodiment of the DRAM device.

An important advantage of the vertical FET structure 120 depicted is the direct contact of expitaxially grown bulk region 146 with substrate 122 such that accurate back biasing of the bulk region is possible, which thereby ensures more consistent transistor turn on and turn off characteristics. In addition, all diffusions and electrodes are accomplished within the vertical trench using only the original multi-layer mask 121. Additional mask(s) would be needed assuming conventional circuit wiring levels are used to connect to the trench transistor. Thus, continuous processing within the trenches can occur uninterrupted, i.e., without requiring return to a lithography process. All structures are self-aligned within the trench and, therefore, of greater density. This particular field effect transistor embodiment allows very exact control over the first and second node diffusions within the trench, similar to the process control provided in connection with fabrication of the access transistor depicted in FIGS. 7–12. Further, a plurality of vertical trench FETs may be combined, either alone or in further combination with conventional planar structures. Also, all diffusions are contained within the trench, thereby enhancing device performance and minimizing layout area for the transistors of a given integrated circuit.

A fabrication process for a vertical field effect transistor trench device such as depicted in FIG. 15 is next described with reference to FIGS. 15–19.

Referring first to FIG. 16, processing assumes provision of monocrystalline substrate of a first conductivity type (such as P+ conductivity portion 126) above which a buried diffusion of second conductivity type (i.e., N+ conductivity type) is formed. Subsequent formation of the buried diffusion, an epitaxial layer 130 of first conductivity type material (e.g., P− conductivity) can be formed above the surface of the polycrystalline substrate. The resultant assembly comprises composite substrate 122 and has an upper surface 132. Preferably, a gap 129 in buried contact 128 connects layer 126 with layer 130 for the application of a biasing potential thereto. A multi-layered mask 121 (described above) is formed on upper surface 132 of composite substrate 122. Multi-layer mask structure 121 is patterned to define an opening 125 through which a trench 124 is etched into the semiconductor material. Trench 124 comprises a vertical trench which must extend to buried diffusion layer 128 in composite substrate 122. Once trench 124 is defined, a thin layer of dielectric material 150 is conformally deposited and RIE etched so that the material only remains on the vertical sidewall of trench 124 including (temporarily) the upper portion of the trench sidewall.

Figure 17:
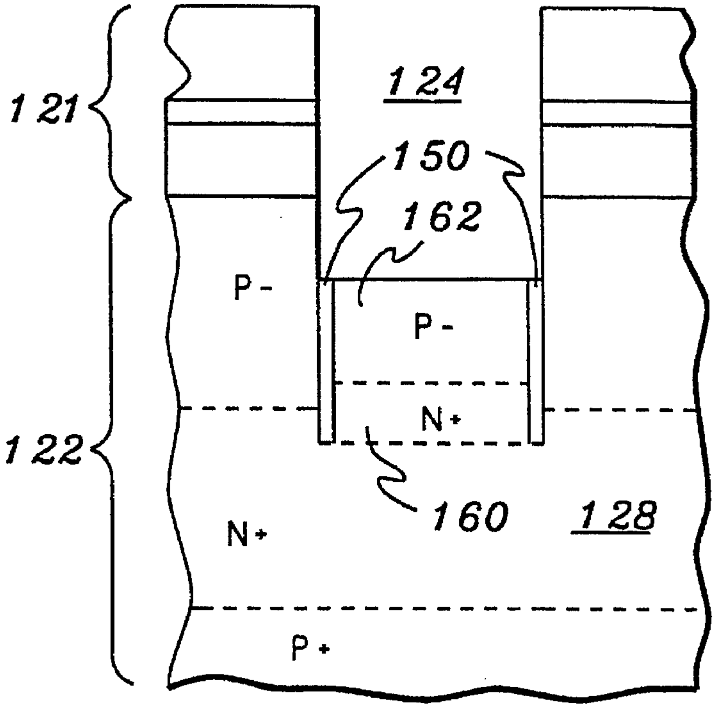
Figure 18:
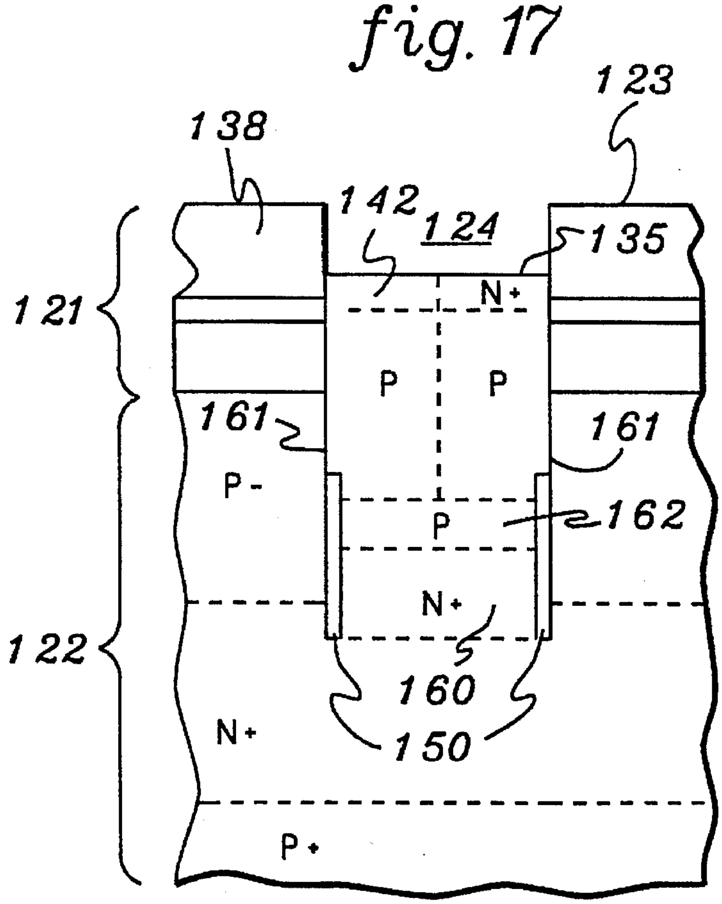

An N+ silicon region 160 of epitaxial material followed by a P− silicon region 162 are next selectively formed at the bottom of trench 124 (see FIG. 17). Thereafter, the exposed sidewall oxide above this selectively formed epitaxial material (i.e., above P− region 162) is removed from trench 124. Note that N+ epi layer 160 in the bottom of trench can be phosphorous (P) doped to diffuse upward faster than the doped buried layer 128, which may be arsenic (As) doped. Alternatively, bottom epi 160 could be (As) doped to a higher point vertically than depicted in FIG. 17. In either case, the objective is to make the final P–/N+ junction at a proper vertical position, i.e., within the trench space contained by sidewall dielectric 150.

Next, selectively deposited epitaxial material (such as P conductivity doped silicon) is grown to entirely fill trench 124 to a level above top surface 123 of multi-layer mask 121. Various publications are available in the open literature for describing the filling of a trench with epitaxial material. This P conductivity type epitaxy is monocrystalline. Diffusion of dopant from node 160 into the epitaxial growth may either comprise part of the epitaxial growth process or, if epitaxy occurs at a sufficiently low temperature, as part of a separate thermal cycle. A large empirical database exists in the open literature for appropriate epitaxial growth times and temperatures to attain a desired structure.

The over fill of epitaxy is polished back to replanarize top surface 123 of multi-layer mask 121, subsequent which the upper portion of the epitaxy is recessed back to a desired level 135. Thereafter, ion implantation of N+ dopant may be established to define a first node or source/drain region 142 in a top portion of the trench epitaxy. Alternatively, first node 142 could be defined via a diffusion of dopant from layer 138 in a manner identical to that described above in connection with fabrication of the dynamic memory cell embodied in FIGS. 7–14.

Figure 19:
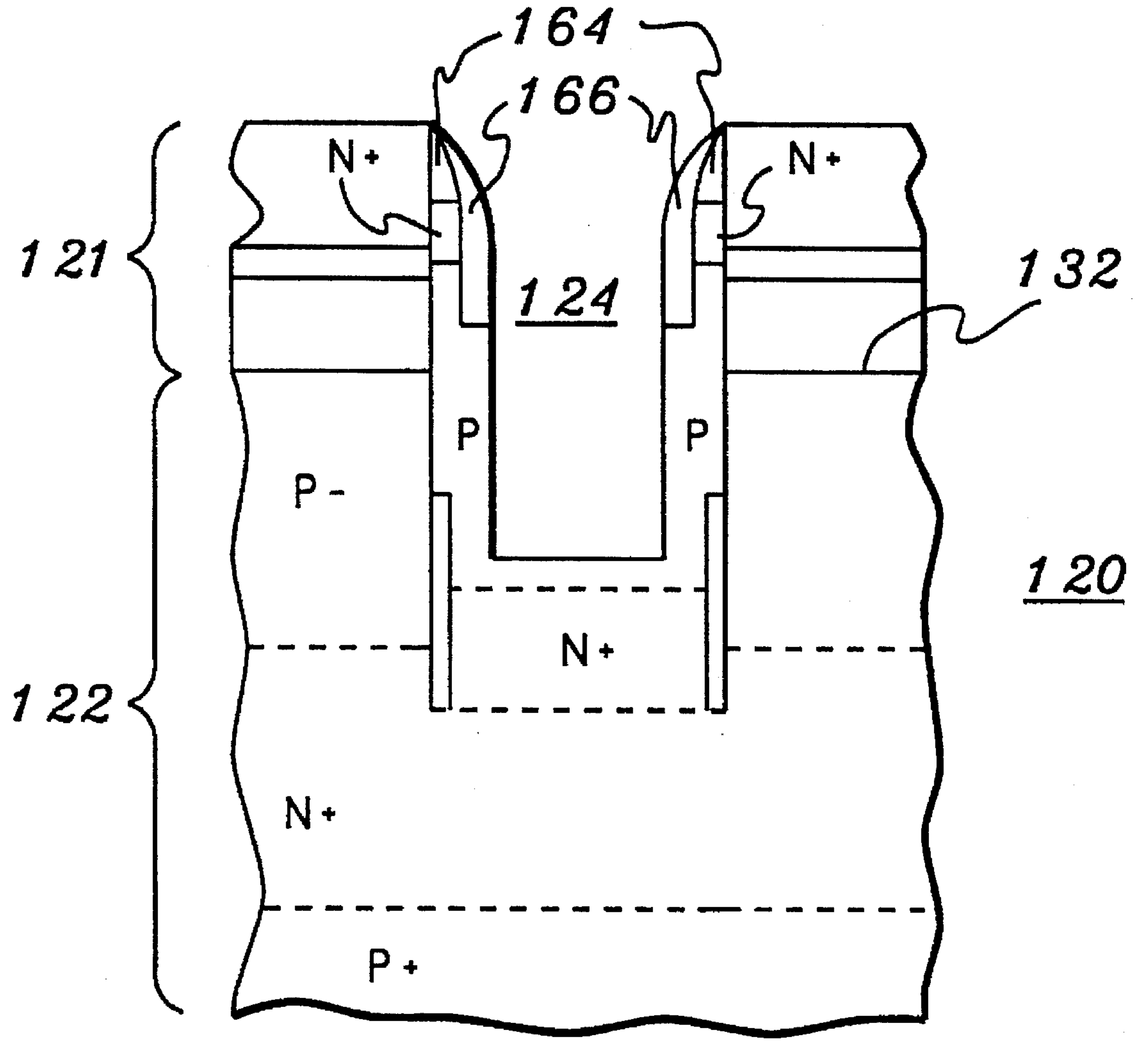

Referring next to FIG. 19, two oxide sidewall spacers 164 and 166 are sequentially formed at the upper end of the epitaxial growth adjacent the trench sidewalls as described above in connection with the access transistor in FIGS. 7–14. (Briefly, a first oxide sidewall spacer 164 is conformally deposited and RIE etched to remain only on the sidewall, thereafter further etching at the center of the trench occurs. Next, a second oxide sidewall spacer 166 is identically formed and further epi etching proceeds to a desired level.)

Finally, the structure of FIG. 15 is obtained by formation of a gate oxide 148 on the exposed surfaces of the epitaxial layer in the center of trench 124, followed by deposition of a gate electrode 140 (e.g., comprising polysilicon material). Gate 140 can be produced by over filling the trench, planarizing the over fill back to top surface 123 and then, preferably, etching the polysilicon material to provide room for a cap 154. As already noted, a gate cap such as a silicide can facilitate electrical contact to gate 140.

Again, P-channel devices can be made by a complementary series of steps and structures as those discussed above. Also, either reach through diffusions or silicon filled trenches can be used to contact the buried N+/P+ diffused layers. The sidewall metal interconnect layer is efficient for providing N-channel to P-channel diffusion connections, and .for gate to diffusion cross-coupling, e.g., in SRAM cells and latches. Thus, planar metallization could be reserved for more global connections and wirings.

As a further modification on the memory cells depicted in FIGS. 2 & 7, FIG. 20 presents a memory cell 200 having a dual storage node capacitance, along with a basic cell structure as described above. Because of the very high density of the dynamic memory cells described herein (for example, approximately 0.5 $\mu m^2$) reduced storage capacitance size can be experienced. The purpose of the cell embodiment depicted in FIG. 20 is to restore capacitance to a higher level. The total storage capacitance of the structure depicted in FIG. 20 is nearly double that compared with the device of FIG. 7. Memory cell 200 is formed in a semiconductor substrate 202 upon which a protective mask 204 is disposed. A trench 206 extends through mask 204 into substrate 202 by a distance comparable to that noted above in connection with the dynamic memory cells of FIGS. 2 & 7. A lower portion of trench 206 is occupied by a dual storage node 208, while an access transistor 210 occupies an upper portion of trench 206. Transistor 210 is substantially identical to that discussed above in connection with FIG. 7. Reference should be made to the description provided therein for the features thereof and a fabrication embodiment therefore.

Dual storage node 208 includes a central plug 212 which is in electrical contact with substrate 202 at the bottom surface of trench 206. Assuming substrate 202 has a P+ conductivity, then plug 212 comprises polysilicon material having a P+ conductivity doping. The capacitor's storage electrode 214 is isolated from inner trench plug 212 by a first dielectric material 216 and is isolated from substrate 202 by a second dielectric material 218. A dielectric cap 220 isolates inner storage plate 212 from the field effect transistor disposed in the upper portion of trench 206.

The advantage to this structure is that the area is doubled for the storage of capacitance via inner plug 212 and the disposition of electrode node 214 between plug 212 and substrate 202. Many of the fabrication steps are identical to those described above in connection with the dynamic memory cell of FIGS. 7–14, and in particular with respect to fabrication of a vertical epitaxial SOI transistor in the upper portion of trench 206. One embodiment of a fabrication process for the dual storage node 208 of device 200 is next described with reference to FIGS. 20–25.

Figure 21:
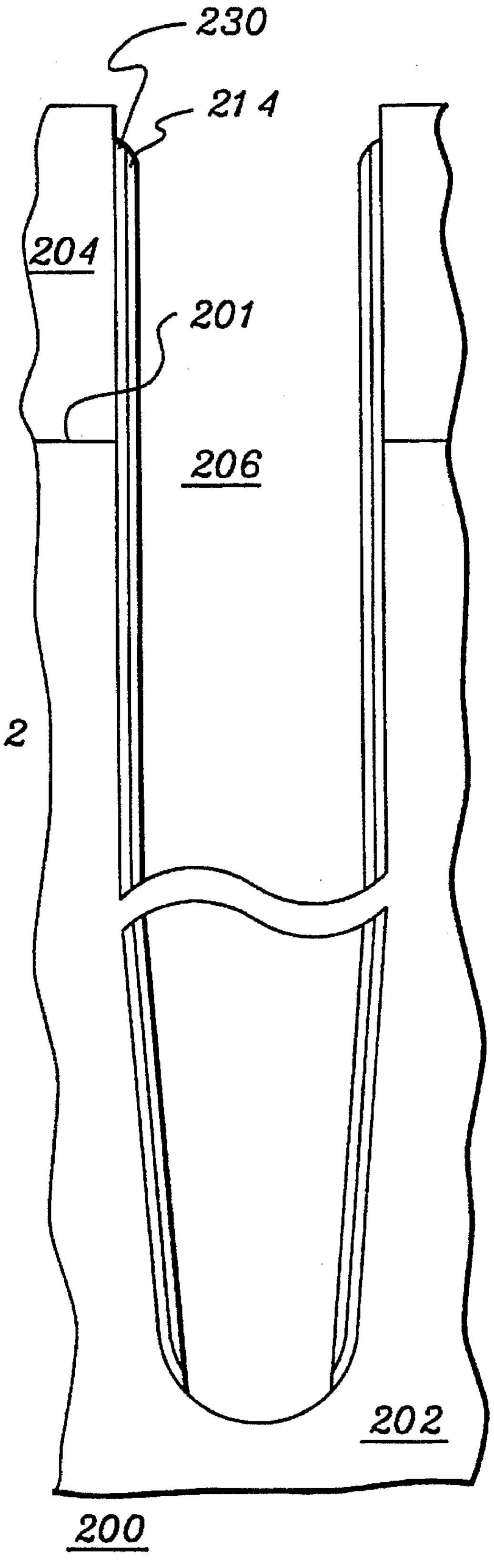
Figure 22:
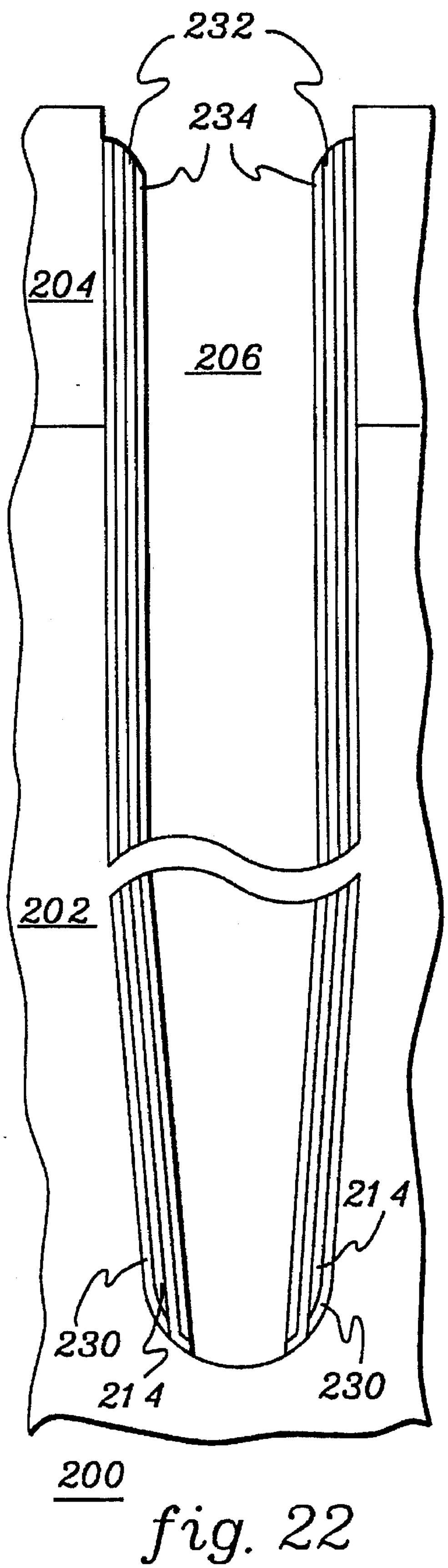
Figure 23:
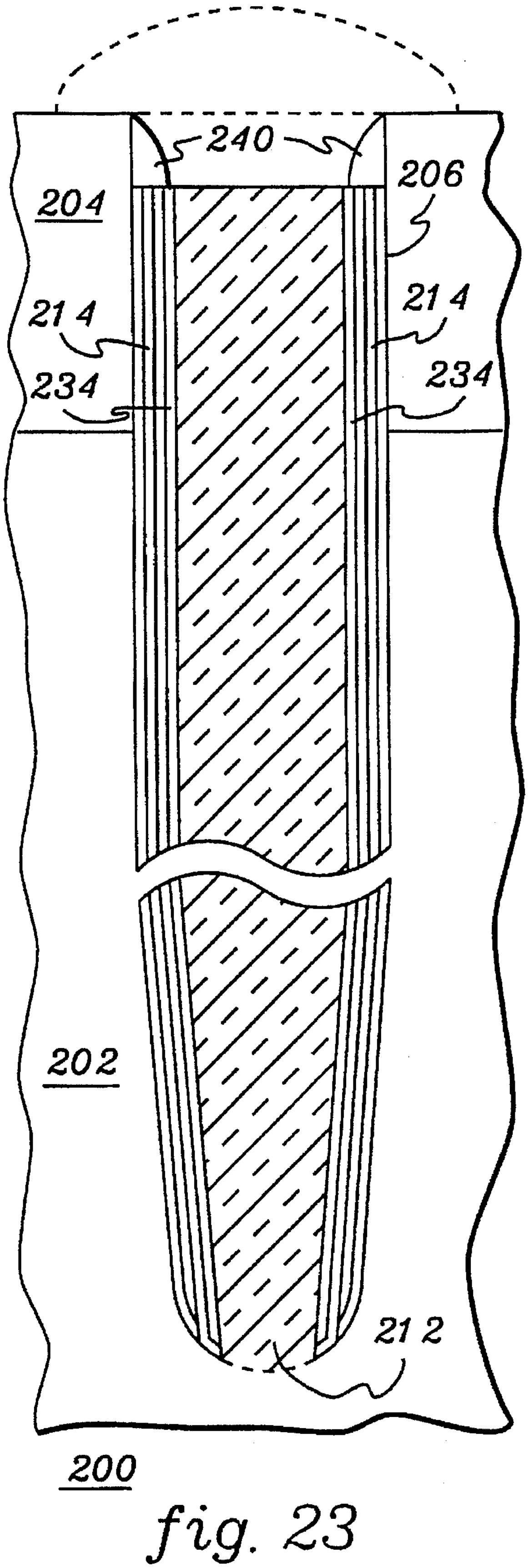
Figure 24:
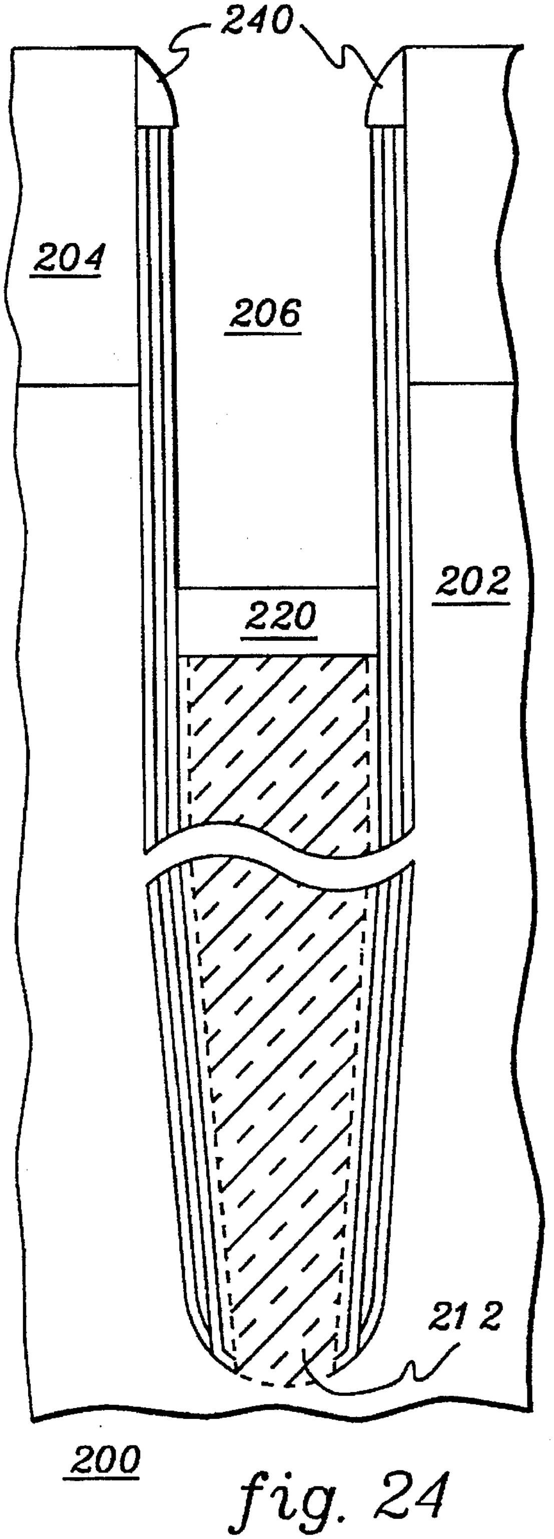
Figure 25:
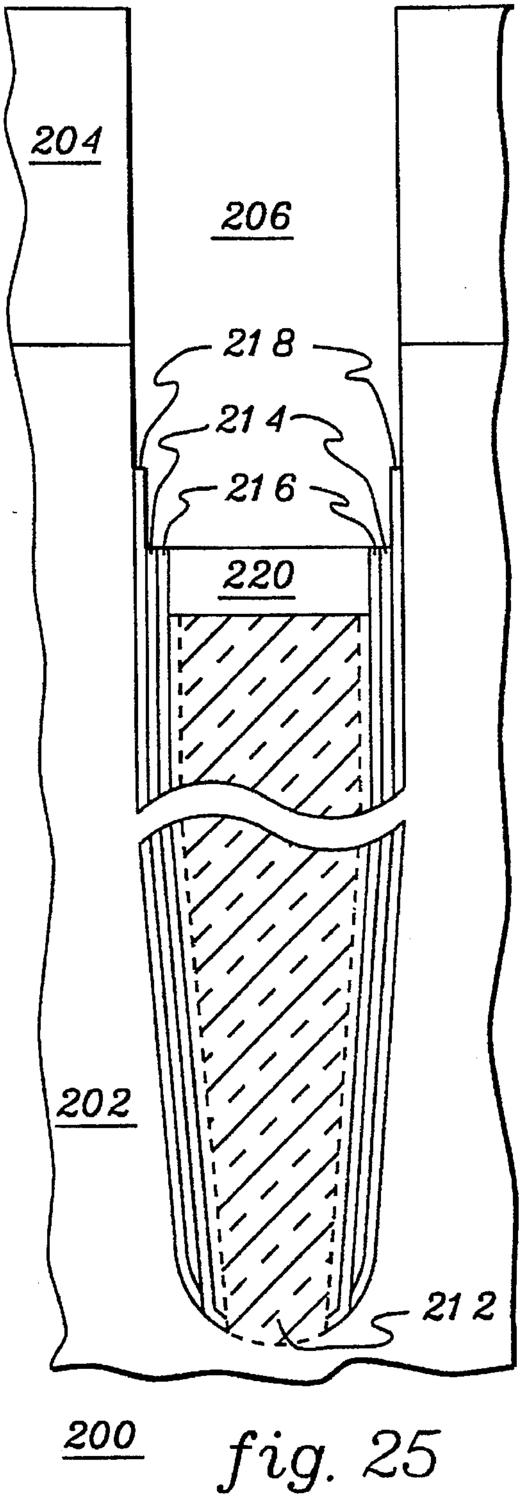

Referring first to FIG. 21, fabrication assumes provision of a composite substrate 202 such as that discussed above in connection with FIG. 7. A thick dielectric 204, such as an oxide, is disposed on the upper surface 201 of composite substrate 202. Thereafter, the dielectric is patterned and a trench 206 is etched to extend through mask 204 a sufficient distance into substrate 202. Next, a node dielectric 230 is conformally deposited along the inner sidewall of trench 206. Thereafter, a conformal layer of polysilicon 214 is deposited (CVD). RIE etching next occurs to remove both the polysilicon and the node dielectric 230 from the planar surface and trench bottom as shown in FIG. 21. Note that the node sidewall dielectric 230 is protected from damage during this RIE etching by the sidewall node polysilicon 214. As shown in FIG. 22, a second node dielectric 232 is similarly conformally deposited, and followed by CVD deposition of a polysilicon layer 234 and RIE etching of the combination from the planar surface and the trench bottom. An appropriate thickness for the dielectric layers is approximately 10 nanometers, while the polysilicon layers might be closer to 25 nanometers.

CVD filling of trench 206 with polysilicon material 212 (FIG. 23) next occurs to overflow the trench above dielectric 204. Thereafter, chemical/mechanical polishing of the polysilicon replanarizes the upper surface of dielectric 204 and RIE etching is used to recess the polysilicon layers, i.e., both polysilicon nodes 214 and 234, along with polysilicon fill 212. Recess proceeds to approximately 0.2 μms below the upper surface of the trench. Wet etching is then employed to remove the node dielectrics exposed within the recess, and a sidewall spacer 240 (for example, silicon nitride ($Si_3N_4$)) is fabricated. The exposed polysilicon comprises center fill 212 along with polysilicon layer 234 in direct contact therewith.

As a next step, RIE etching of the exposed polysilicon fill (212 & 234) occurs to an appropriate depth (e.g., 0.5 μm) below the planar silicon surface. Thereafter a plasma mode silicon etch or a wet silicon etch may be used to remove all residual sidewall polysilicon 234 down to the fill etch (see FIG. 24) The exposed polysilicon is then thermally oxidized to form a cap oxide 220 on the upper surface of the polysilicon fill 212. Cap oxide 220 may be approximately 100 nanometers thick. If desired this step can be proceeded by a CVD silicide nitride "collar" fabrication step, which may be necessary to prevent oxidation through the sidewall node dielectric.

Next, selected removal of nitride sidewall layers and the exposed sidewall node polysilicon is conducted. The trench is filled with an organic material which is planarized and $O_2$ RIE etched to about 150–200 nm above cap oxide 220. Selective removal of sidewall node dielectric is pursued to expose the sidewall single crystal substrate 202. The remaining organic material (not shown) is subsequently removed resulting in the structure of FIG. 25. At this point, transistor fabrication processing can follow that discussed above in connection with the fabrication of a dynamic memory cell of FIG. 7. One completed embodiment of such a structure is depicted in FIG. 20.

Note that the structure of FIG. 20, as in the embodiment of FIG. 7, can be applied to N or P channel arrays, and also to an array in a well or an array in a substrate. Note also that the bottom cap oxide acts as an etch stop under the central core of trench filled polysilicon. This should effectively prevent unwanted propagation of etching deep into the trench.

It will be noted from the above discussion that the trench structures and fabrication methods presented herein are all readily implementable with present technology and improve upon existing cell density. A transistor bulk region is epitaxially formed on an exposed sidewall of the semiconductor trench such that the bulk region becomes integral with the substrate for receiving a back biasing signal therefrom. A portion of grown epitaxial material (that portion forming one of the nodes of the transistor) is isolated from contact with the substrate thereby ensuring containment of the transistor within the vertical sidewall of the substrate trench. Various structures for containing device diffusions within the trench are presented.

Further, the structures presented are susceptible to continuous processing using a single lithographic mask. Also, a novel technique is presented for placing for example, two bit lines within a minimum lithographic distance in a memory cell array. The wiring technique could be readily implemented in other type structures as well. All of the structures and methods presented are readily adaptable to mixing with conventional planar fabricated structures as desired. A dual storage node structure and fabrication technique is also described for enhancing the signal storage capability of each cell.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

I claim:

1. A method for forming a vertical epitaxial SOI transistor in a composite substrate having a buried contact therein, said method comprising the steps of:

(a) forming a trench in said composite substrate, said trench extending from an upper surface of said substrate and terminating within said buried contact, said trench having an exposed sidewall, and an upper portion and a lower portion; and (b) fabricating a transistor to reside entirely within the trench formed in said step (a) by (i) forming a lower node of said transistor in said lower portion of said trench, said lower node being formed in electrical contact with said buried contact region within said composite substrate, (ii) selectively growing epitaxial material on the exposed trench sidewall in the upper portion of said trench such that the direction of epitaxial growth is laterally inward towards a center region of said trench, said epitaxial material grown on the exposed trench sidewall of the upper portion of the trench comprising in part a bulk region of said transistor, said epitaxially grown bulk region being electrically connected to said substrate for receiving a back biasing potential therefrom, (iii) forming an upper node of said transistor within an upper end of said epitaxially grown material, (iv) forming a gate electrode of said transistor in a center region of said upper trench portion proximate said bulk region such that when said gate electrode is appropriately biased an inversion layer forms in said bulk region near said gate electrode, said inversion layer extending between said lower node and said upper node, and wherein said selective epitaxial growing of said step (b)(ii) includes continuing said selective epitaxial growth such that epitaxial material overflows said substrate trench, and thereafter planing, patterning and etching said epitaxially grown material such that a center region opening is defined within the upper portion of said substrate trench, said center region opening being sized to receive said gate electrode formed in said step (b)(iv).

2. The transistor forming method of claim 1, wherein said lower transistor node is formed by selectively growing epitaxial material only on an exposed portion of said buried contact region.

3. The transistor forming method of claim 2, wherein said epitaxial material grown in said step (b)(ii) comprises monocrystalline epitaxial material, and wherein said selectively growing of said lower node formation and said bulk region epitaxial growth formation occur substantially simultaneously within said trench.

4. The transistor forming method of claim 3, wherein said transistor fabricating step (b) includes forming a dielectric isolation region adjacent said trench substrate sidewall so as to contain said lower node formed in said step (b)(i) within said substrate trench and isolate said lower node from contact with said substrate.

5. The transistor forming method of claim 3, wherein said upper node forming step (b)(iii) includes diffusing a dopant into said upper end of said epitaxially grown monocrystalline material of said step (b)(ii).

6. The transistor forming method of claim 1, wherein upon completion of said step (b)(ii) a middle region of said upper trench portion remains open for receiving said gate electrode to be formed in said step (b)(iv).

7. A method for forming a plurality of vertical epitaxial SOI transistors in a composite substrate so as to define an array of transistors, said method comprising simultaneously executing the method of claim 1 for each of a plurality of vertical transistors, thereby defining said array.

8. A method for forming a uniform epitaxial material on an exposed sidewall of a trench formed in a substrate, said method comprising:

(a) growing epitaxial material on the exposed trench sidewall, wherein the direction of epitaxial growth is laterally inward towards a center region of the trench, said growing of epitaxial material continuing until the epitaxial material overflows said substrate trench;

(b) planarizing the epitaxial material above an upper surface of the substrate;

(c) forming a recess within the epitaxial material;

(d) forming a sidewall spacer within the recess formed within the epitaxial material such that only a center region of the epitaxial material grown within the trench remains exposed within the recess; and (e) etching said exposed center region of epitaxial material from the trench, wherein an epitaxial layer remains on the trench sidewall that is uniform notwithstanding different sidewall crystal orientations of the substrate, said epitaxial layer being disposed beneath said sidewall spacer.

9. The method of claim 8, wherein the exposed sidewall of the trench formed in the substrate comprises a vertical sidewall, and wherein the method comprises forming the uniform epitaxial layer on the vertical sidewall such that the epitaxial layer has uniformity in a vertical direction.

10. The method of claim 8, wherein said sidewall spacer forming step (d) produces a sidewall spacer of uniform thickness about said trench such that said epitaxial layer remaining on the trench sidewall beneath said sidewall spacer is horizontally uniform within the trench notwithstanding different sidewall crystal orientations of the substrate.

* * * * *